(12) United States Patent
Doris et al.

(10) Patent No.: US 12,256,586 B2
(45) Date of Patent: Mar. 18, 2025

(54) CURRENT CONTROL SYSTEMS AND METHODS

(71) Applicant: Palo Alto Research Center Incorporated, Palo Alto, CA (US)

(72) Inventors: Sean E. Doris, San Francisco, CA (US); Warren B. Jackson, San Francisco, CA (US); Adrien Pierre, Berkeley, CA (US)

(73) Assignee: Xerox Corporation, Norwalk, CT (US)

( * ) Notice: Subject to any disclaimer, the term of this patent is extended or adjusted under 35 U.S.C. 154(b) by 1032 days.

(21) Appl. No.: 17/208,690

(22) Filed: Mar. 22, 2021

(65) Prior Publication Data
US 2021/0210796 A1    Jul. 8, 2021

Related U.S. Application Data

(62) Division of application No. 16/152,795, filed on Oct. 5, 2018, now Pat. No. 10,971,765.

(51) Int. Cl.
*H10K 19/10*    (2023.01)
*H01G 9/00*    (2006.01)
(Continued)

(52) U.S. Cl.
CPC ........... *H10K 19/10* (2023.02); *H01G 9/0029* (2013.01); *H01G 9/0036* (2013.01); *H01G 9/025* (2013.01);
(Continued)

(58) Field of Classification Search
None
See application file for complete search history.

(56) References Cited

U.S. PATENT DOCUMENTS

| 8,306,757 B2 | 11/2012 | Rothberg et al. |
| 8,503,059 B2 * | 8/2013 | De Paiva Martins .. G02F 1/163 257/213 |

(Continued)

FOREIGN PATENT DOCUMENTS

| FR | 3048549 A1 * | 9/2017 | ......... G01N 27/4145 |
| WO | WO-2018185257 A1 * | 10/2018 | ........... G01N 27/414 |

OTHER PUBLICATIONS

Colclasure et al., "Thermodynamically consistent modeling of elementary electrochemistry in lithium-ion batteries", Electrochimica Acta, 55, 2010, pp. 8960-8973.

(Continued)

*Primary Examiner* — Scott B Geyer
(74) *Attorney, Agent, or Firm* — Mueting Raasch Group

(57) ABSTRACT

A system that includes an energy device having an active region configured to generate or consume electrical energy provided by an electrical current is discussed. A current limiter is disposed between the energy device and a current collector layer. The current limiter controls the current flow between the energy device and the current collector layer. A plurality of electrochemical transistors (ECTs) are arranged in an array such that each ECT in the array provides localized current control for the energy device. Each ECT includes a gate electrode, a drain electrode, a source electrode, and a channel disposed between the drain and the source electrodes. An electrolyte electrically couples the gate electrode to the channel such that an electrical signal at the gate electrode controls electrical conductivity of the channel. The current collector layer is a shared drain or source electrode for the ECTs.

22 Claims, 33 Drawing Sheets

(51) Int. Cl.
*H01G 9/025* (2006.01)
*H01G 9/04* (2006.01)
*H01G 9/07* (2006.01)
*H01G 9/22* (2013.01)
*H01G 9/26* (2006.01)
*H01G 9/28* (2006.01)
*H01M 10/42* (2006.01)
*H10K 10/46* (2023.01)
*H10K 10/82* (2023.01)
*H10K 85/10* (2023.01)
*H01L 31/053* (2014.01)

(52) U.S. Cl.
CPC ............... *H01G 9/04* (2013.01); *H01G 9/07* (2013.01); *H01G 9/22* (2013.01); *H01G 9/26* (2013.01); *H01G 9/28* (2013.01); *H01M 10/4257* (2013.01); *H10K 10/46* (2023.02); *H10K 10/82* (2023.02); *H10K 85/1135* (2023.02); *H01L 31/053* (2014.12); *H01M 2010/4271* (2013.01)

(56) References Cited

U.S. PATENT DOCUMENTS

| | | |
|---|---|---|
| 8,853,667 B2 | 10/2014 | Jain et al. |
| 9,343,781 B2 | 5/2016 | Shrader et al. |
| 9,989,488 B2 * | 6/2018 | Borini ............... G01N 27/4146 |
| 2002/0134980 A1 * | 9/2002 | Armgarth ............... C09K 9/02 438/22 |
| 2004/0256644 A1 * | 12/2004 | Kugler ................. H10K 10/46 257/288 |
| 2006/0261676 A1 * | 11/2006 | Robinson ............... H01H 43/32 307/65 |
| 2007/0138463 A1 * | 6/2007 | Herlogsson .......... H10K 10/468 257/40 |
| 2009/0042346 A1 * | 2/2009 | Kugler ................ H10K 10/474 438/197 |
| 2009/0122465 A1 * | 5/2009 | Lin .................... H01L 29/78681 257/E21.409 |
| 2015/0115227 A1 * | 4/2015 | Yan .................... G01N 27/4145 438/49 |
| 2016/0116433 A1 * | 4/2016 | Seong ................. H10K 10/484 438/49 |
| 2018/0013082 A1 * | 1/2018 | Allen .................... H10K 71/50 |
| 2020/0096475 A1 * | 3/2020 | Scavetta ............ G01N 27/4146 |

OTHER PUBLICATIONS

Doris et al., "Dynamic and Tunable Threshold Voltage in Organic Electrochemical Transistors", Advanced Materials 30 (15), Mar. 2018, 5 pages.

* cited by examiner

CURRENT CONTROL SYSTEMS AND METHODS

RELATED APPLICATIONS

This application is a divisional of U.S. patent application Ser. No. 16/152,795, filed Oct. 5, 2018, to which priority is claimed pursuant to 35 U.S.C. § 119(e), and which is incorporated herein by reference in its entirety.

TECHNICAL FIELD

This disclosure relates generally to systems that employ electrochemical transistors to control local current flow through energy producing or consuming devices and to methods related to such systems.

BACKGROUND

Electrochemical cells (e.g. batteries) are becoming essential in future electronic and transportation applications. There is significant interest in increasing battery capacity and energy density, reducing the charging time, and increasing the battery lifetime for various mobile applications such as cell phones, laptops, and electric vehicles. One of the major challenges in improving these battery characteristics is the prospect of uncontrolled runaway reactions where current hot spots (due to inhomogeneities in the electrode structure) accelerate undesirable side-reactions or filament formation. Furthermore, any manufacturing defects that result in internal shorts can allow the entire battery capacity to rapidly discharge through the internal short, causing the battery to rapidly heat up and fail catastrophically. In order to design around this potential safety problem, some battery packs include sophisticated thermal and electrical management systems that increase the cost, mass, and volume of the batteries. Even with these sophisticated systems, battery pack designers have no control over current flow within a single cell, which forces them to over-engineer at the battery pack-level.

BRIEF SUMMARY

Some embodiments are directed to a system that includes an energy device which includes an active region configured to generate or consume electrical energy provided by an electrical current. A current limiter is disposed between the energy device and a current collector layer. The current limiter controls the current flow between the energy device and the current collector layer. The current limiter comprises a plurality of electrochemical transistors (ECTs) arranged in an array such that each ECT in the array provides localized current control for the energy device. Each ECT includes a gate electrode, a drain electrode, a source electrode, and a channel disposed between the drain and the source electrodes. An electrolyte electrically couples the gate electrode to the channel such that an electrical signal at the gate electrode controls electrical conductivity of the channel. The current collector layer is a shared drain or source electrode for the ECTs.

Some embodiments involve a method of making a current limiter comprising an array of ECTs. A channel semiconductor layer is deposited in a pattern such that multiple discrete regions of the channel semiconductor layer contact a current collector layer. A solid state electrolyte layer is deposited in a pattern of multiple discrete regions such that each discrete region of the solid state electrolyte layer respectively contacts a discrete region of the channel semiconductor layer. A layer of conductive material is deposited in a pattern of discrete regions such that each discrete region of the conductive material layer respectively contacts a discrete region of the channel semiconductor layer. A gate electrode layer is deposited in a pattern of discrete regions such that each discrete region of the gate electrode layer respectively contacts a discrete region of the solid state electrolyte layer. Each discrete region of the gate electrode layer may contact a discrete region of the conductive material layer, the current collector layer, or may be electrically connected to a sensor or to other control circuitry.

BRIEF DESCRIPTION OF DRAWINGS

FIGS. 20A through 23A and 20B through 23B illustrate top down and side views, respectively, of intermediate steps in a method for preparing a current limiter in accordance with some embodiments;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments herein relate to systems for controlling the current distribution within an energy device that produces or consumes energy. Current flowing through the energy device either provides energy to the device or provides energy generated by the device to an external load. In various embodiments discussed herein, the current distribution across a surface of the energy device is controlled by a current limiter comprising an array of electrochemical transistors (ECTs) operating under passive or active control. In some embodiments the device is an energy producing device that generates output current controlled by the current limiter. Examples of energy producing devices include a battery cell during discharge, a fuel cell, and a photovoltaic cell. In some embodiments the device is an energy consuming device in which current flowing through the device provides energy to the device. Examples of energy absorbing devices include a battery cell during charging, electroplating and electro-etching cells, and/or other types of electrochemical or photoelectrochemical cells. For simplicity, both energy absorbing and energy producing devices are referred to herein as an "energy device".

Figure 1:
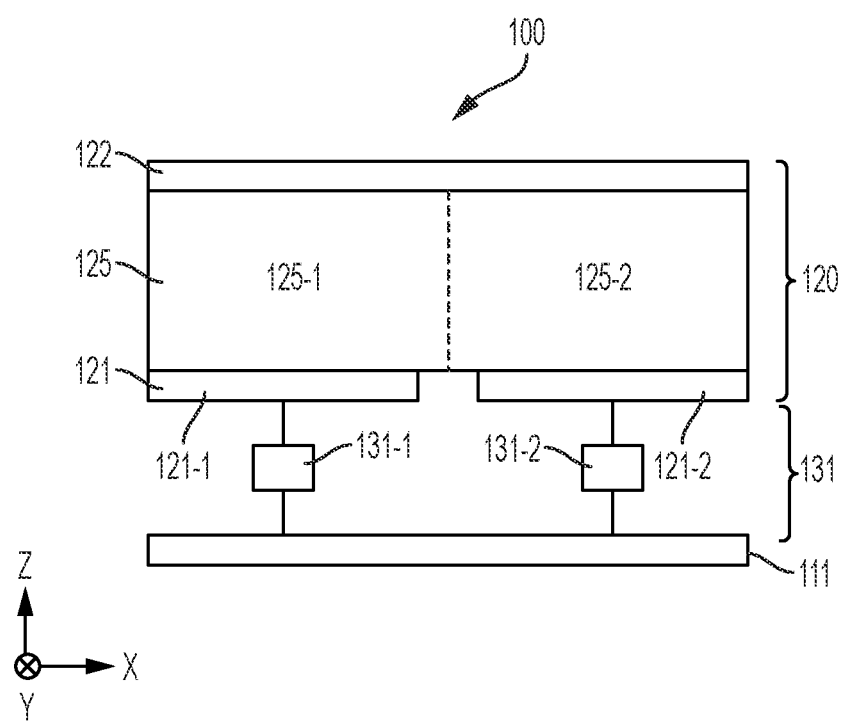
FIG. 1 shows a side view of a system incorporating a current limiter in accordance with some embodiments.

FIG. 1 shows a view of a system 100 incorporating a current limiter 131 in accordance with some embodiments. The system 100 includes at least one current collector electrode 111 and a device 120 that includes an active region 125 configured to produce or consume electrical current. The device 120 may include first 121 and second 122 electrically conductive layers that are electrically coupled to the portion of the device 120 that includes the active region 125. As shown in FIG. 1, the first electrically conductive layer 121 is patterned and is electrically connected to the current limiter 131. Each discrete region 125-1, 125-2 of the active region 125 is associated with one of the patterned regions 121-1, 121-2 of the patterned electrically conductive layer 121. One or both of the first and second electrically conductive layers 121, 122 may be patterned.

A current limiter 131 comprising a plurality of ECTs 131-1, 131-2 is electrically connected between the active region 125 of the energy device 120 and the current collector electrode 111. The plurality of ECTs 131-1, 131-2 are arranged in an array such that each ECT 131-1, 131-2 in the array provides localized current control for the device 120. The array of ECTs 131-1, 131-2 in the current limiter 131 and the patterning of the first electrically conductive layer 121 into patterned regions 121-1, 121-2 may be two dimensional, extending along both the x and y axes as indicated in FIG. 1. The ECTs 131-1, 131-2 can operate as p-type depletion mode electrochemical switches, operating in cut-off mode (negligible current flows through the ECT) when the voltage on the control electrode is above the threshold voltage value and operating in saturation mode (current flows through the ECT) when the voltage at the control electrode is below the threshold voltage value. The ECTs 131-1, 131-2 can alternatively be n-type, in which case the signs for the cut-off mode will be reversed from those described above. In some embodiments, the ECTs 131-1, 131-2 can be biased to operate in linear mode to provide localized variable current control.

As discussed in more detail below, each ECT 131-1, 131-2 in the array operates as an electrochemical transistor having drain and source electrodes with a channel disposed between the drain and the source electrodes. An electrolyte electrically couples a gate electrode to the channel such that an electrical signal at the gate electrode controls electrical conductivity of the channel. The current collector electrode 111 serves as a shared drain or source electrode for the ECTs.

Figure 2:
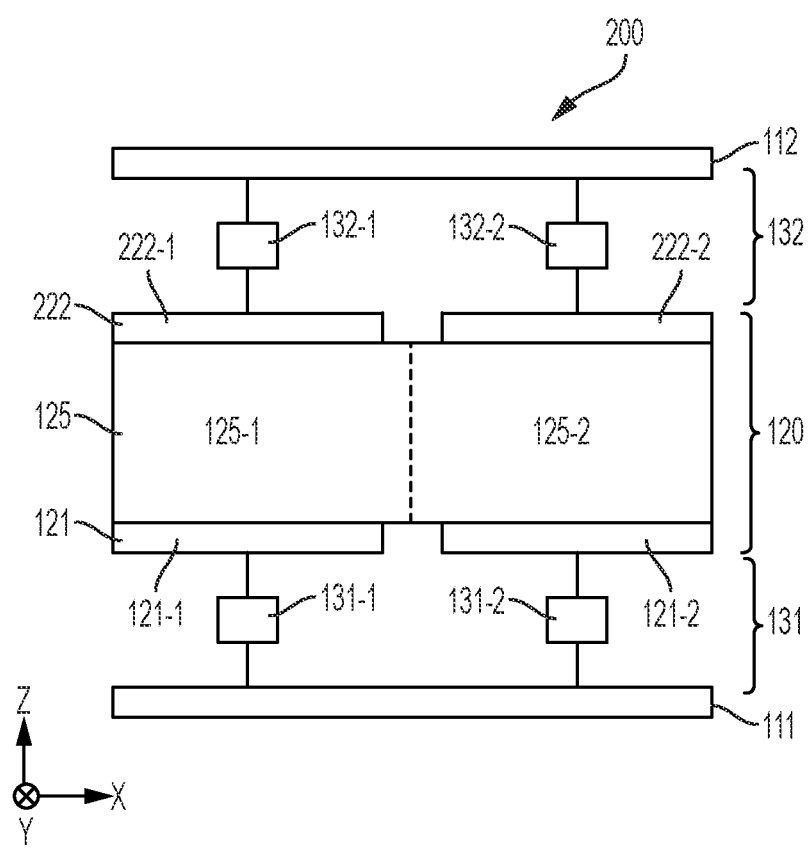
FIG. 2 shows another embodiment of a system that incorporates first and second current limiters.

FIG. 2 shows another embodiment of a system 200 that incorporates first 131 and second 132 current limiters. In this embodiment, the first current limiter 131 includes an array of first ECTs 131-1, 131-2 electrically connected between the portion of the device 120 that includes the active region 125 and the first current collector 111. The second current limiter 132 includes an array of second ECTs 132-1, 132-2 electrically connected between the portion of the device 120 that includes the active region 125 and the second current collector 112. In the embodiment shown in FIG. 2, the first current collector electrode 111 is a shared drain or source electrode for the first ECTs 131-2, 131-2 and the second current collector electrode 112 is a shared drain or source electrode for the second ECTs 132-1, 132-2.

The device 120 includes first 121 and second 222 electrically conductive layers that are electrically coupled to the active region 125. In the illustrated embodiment of FIG. 2, the first and second electrically conductive layers 121, 222 are patterned such that each discrete region 125-1, 125-2 of the active region 125 is associated with one of the discrete regions 121-1, 121-2, 222-1, 222-2 of the patterned electrically conductive layers 121, 222. As shown in FIG. 2, the first current limiter 131 is disposed between the first current collector layer 111 and the spaced apart regions of the first electrically conductive layer 121. The second current limiter 132 is disposed between the second current collector layer 112 and the spaced apart regions of the second electrically conductive layer 222.

Figure 3:
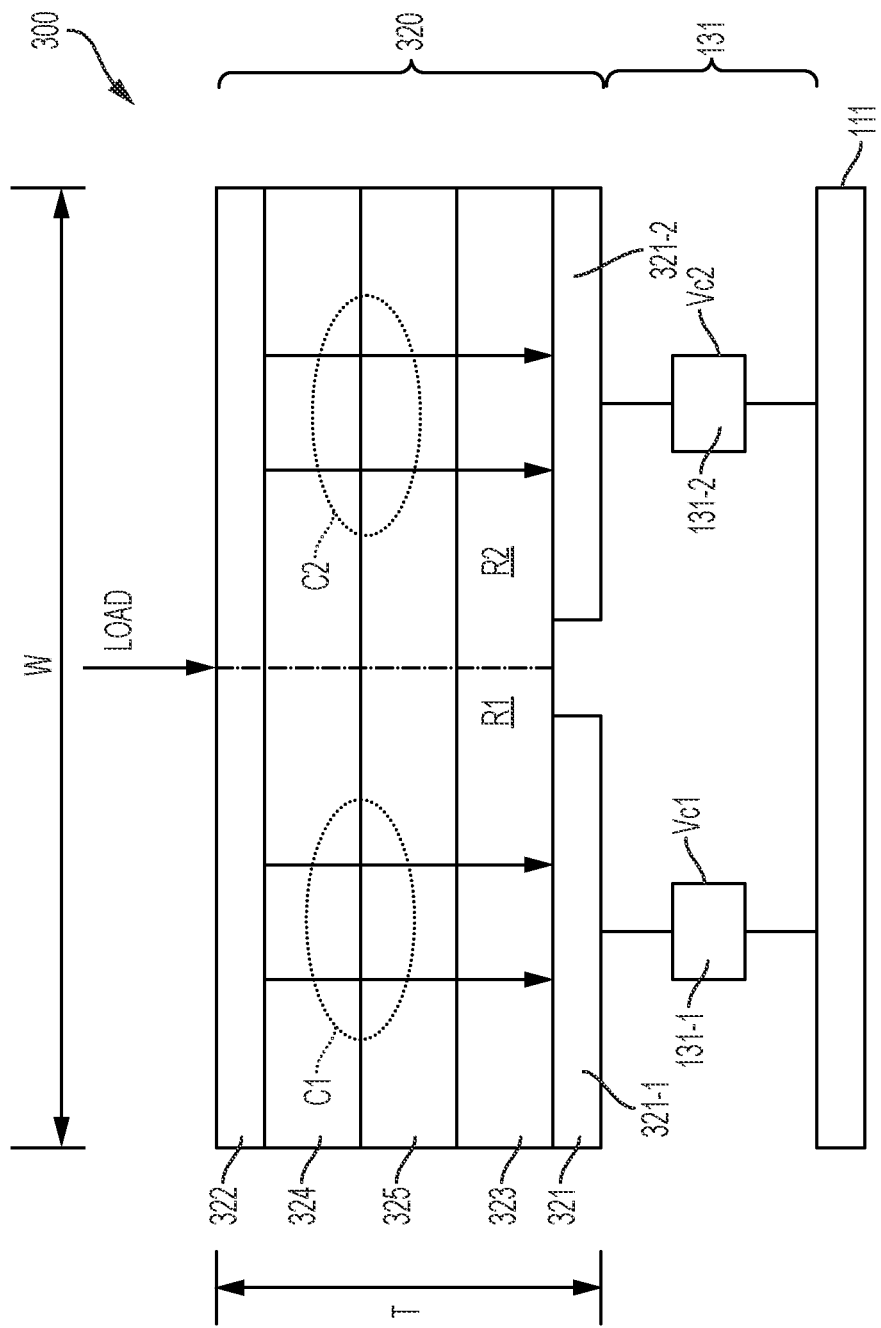
FIG. 3 shows a system as described in FIG. 1 in which the energy device is a battery cell.

Operation of a system incorporating a current limiter used in conjunction with an energy device as disclosed herein is illustrated with reference to FIG. 3. FIG. 3 shows a system 300 as described in FIG. 1 in which the energy device is a battery cell 320. The battery cell 320 may be any type of battery cell, including primary or secondary (rechargeable) types. For example, the battery cell 320 may be a lithium ion battery cell, a nickel metal hydride battery cell or a zinc bromide battery cell.

The battery 320 includes a positive electrode (cathode during discharge) 323, a negative electrode (anode during discharge) 324, and an electrolyte 325 disposed between the positive electrode 323 and negative electrode 324. A patterned electrically conductive layer 321 is electrically coupled to the positive electrode 323. An electrically conductive layer 322 is electrically coupled to the negative electrode 324. In some embodiments, the positive electrode 323 and/or negative electrode 324 may be substantially continuous layers without substantial physical segregation into smaller layer regions. The battery 320 may have relatively large current collection area such that the width, W, of the substantially continuous positive electrode 323 and/or negative electrode 324 layers are substantially larger than a thickness, T, of the battery 320. The large current collection area facilitates control over discrete regions R1, R2 of the battery 320 in which in localized currents C1, C2 flow between the negative electrode 324 and the positive electrode 323 as indicated by the arrows. In this example, localized current C1 is generated and flows in region R1, and localized current C2 is generated and flows in region R2, wherein the magnitude of the current C1 may or may not be equal to the magnitude of the current C2. Note that in this example, the arrows indicate the direction of the net flow of positive charges, and it is appreciated that the charge carriers can be electrons or ions dissolved in the electrolyte 325.

As illustrated in FIG. 3, the first electrically conductive layer 321 of the battery 320 includes spaced apart contact pads 321-1, 321-2 that are electrically connected to the positive electrode 323 of the battery 320 so as to couple each contact pad 321-1, 321-2 to an associated region R1, R2 of the battery 320. As shown, substantially all, e.g., over 75%, over 85%, or even over 95%, of the localized current C1 from region R1 flows through contact pad 321-1 and substantially all, e.g., over 75%, over 85%, or even over 95%, of the localized current C2 from region R2 flows through contact pad 321-2.

Note that although discrete contact pads 321-1, 321-2 are shown in FIG. 3 as being electrically coupled to the positive electrode 323, in other embodiments, discrete contact pads may be electrically coupled to the negative electrode and not to the positive electrode, or a first set of discrete contact pads may be coupled to the positive electrode and a second set of discrete contact pads may be coupled to the negative electrode (see, e.g., FIG. 2).

System 300 facilitates distributed control over localized battery currents generated in discrete battery regions R1 to R2 due to the operating states of ECTs 131-1 to 131-2, respectively. Current C1 flowing through contact pad 321-1 is derived predominantly or exclusively from discrete battery region R1 and localized control over current C1 is achieved by controlling the operating state of ECT 131-1. For example, the magnitude of localized current C1 in battery region R1 is effectively decreased or increased by controlling the current C1 through transistor 131-1. The current C1 can be decreased or increased by adjusting a control voltage Vc1 of the ECT 131-1. Similarly, current C2 flowing through contact pad 321-2 is derived predominantly or exclusively from discrete battery region R2. Localized control over current C2 is achieved by controlling the operating state of ECT 131-2. For example, current C2 can be decreased or increased by adjusting a control voltage Vc2 of the ECT 131-2.

Figure 4:
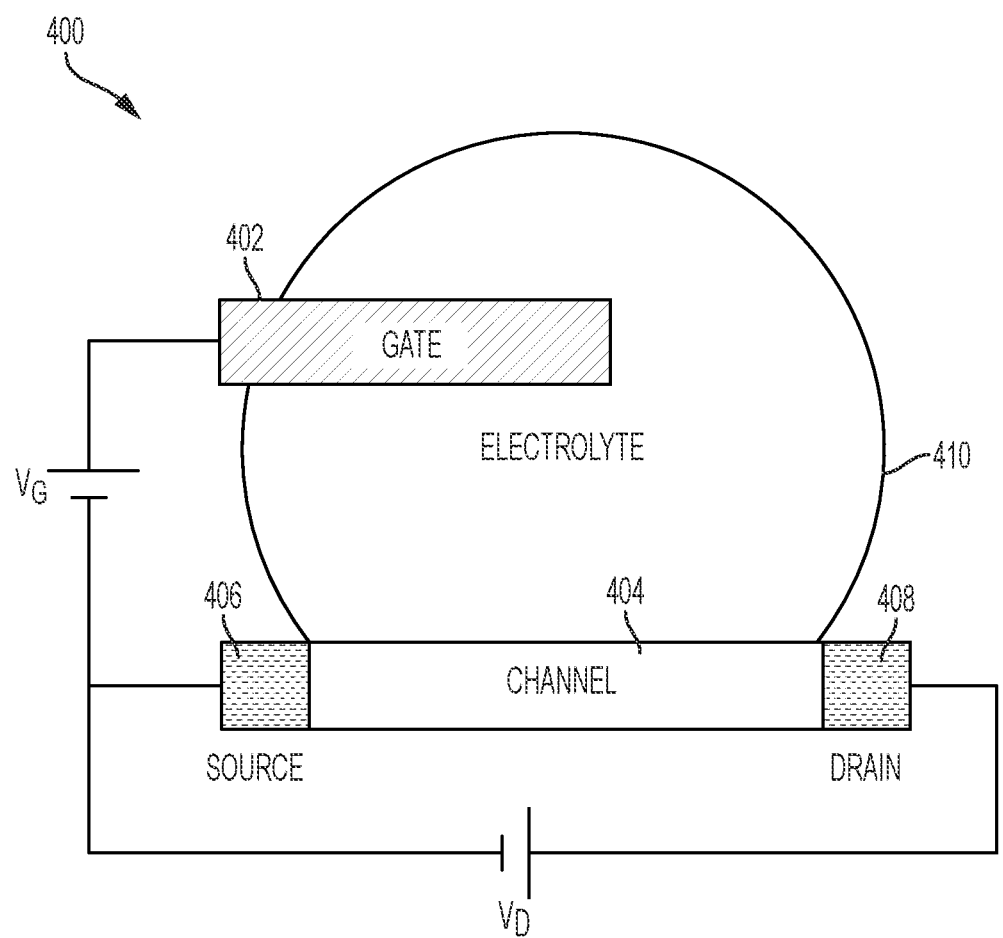
FIG. 4 provides a schematic view of an ECT which may be used for the ECTs of the current limiters shown in FIGS. 1-3 in accordance with some embodiments.

FIG. 4 provides a schematic view of an ECT 400, e.g., an organic ECT (OECT), which may be used for the ECTs 131-1, 131-2 of the current limiter 131 shown in FIGS. 1-3 and/or for the ECTs 132-1, 132-2 of the current limiter 132 shown in FIG. 2, for example. The ECT 400 includes gate electrode 402, channel 404, which typically can include a semiconductor film (e.g., a conjugate polymer film), source electrode 406, drain electrode 408, and electrolyte 410. Source electrode 406 and drain electrode 408 can establish electrical contact to channel 404, while gate electrode 402 establishes electrical contact to electrolyte 410. Electrolyte 410 can be liquid, gel, or solid. In the most common biasing configuration as shown in FIG. 4, a voltage (drain voltage $V_D$) is applied to the drain relative to the source. This can cause a current to flow (drain current), due to electronic charges (usually holes) present in channel 404. When a voltage is applied to the gate (gate voltage $V_G$), charge carriers can be injected into or removed from the channel and charge-compensating ions can be transferred to or from the electrolyte, leading to a change in the electronic charge density and hence the drain current. When the gate voltage is removed and the gate is shorted to the source, the injected charge carriers return to the gate, charge-compensating ions return to the electrolyte, and the drain current goes back to its original value. The terms "drain" and "source" are not meant to imply any particular direction of the flow of positive or negative carriers. The direction of the flow of carriers may be different when a device operates in different modes, e.g., charging or discharging. The terms "drain electrode" or "source electrode" as used herein are arbitrary labels employed for convenience in describing features of the transistors.

PEDOT:PSS (poly(3,4-ethylenedioxythiophene) polystyrene sulfonate) can be used as the channel material due to its commercial availability and high electronic and ionic conductivity. PEDOT:PSS is a polymer mixture of two ionomers. One component in this mixture is made up of polystyrene sulfonic acid, which is a sulfonated polystyrene (or PSS). Part of the sulfonic acid groups are deprotonated and carry a negative charge. The other component, PEDOT, is a conjugated polymer and carries positive charges. Because the organic semiconductor PEDOT is doped p-type by the sulfonate anions of the PSS (the dopant), PEDOT:PSS can exhibit a high (hole) conductivity. Hence, in the absence of a gate voltage, the drain current will be high and the transistor will be in the ON state. When a positive voltage is applied to the gate, the PEDOT is electrochemically reduced and ions from the electrolyte (e.g., NaCl in water) compensate the charge of the sulfonate anions. This leads to de-doping of the PEDOT, and the transistor reaches its OFF state.

Figure 5A:
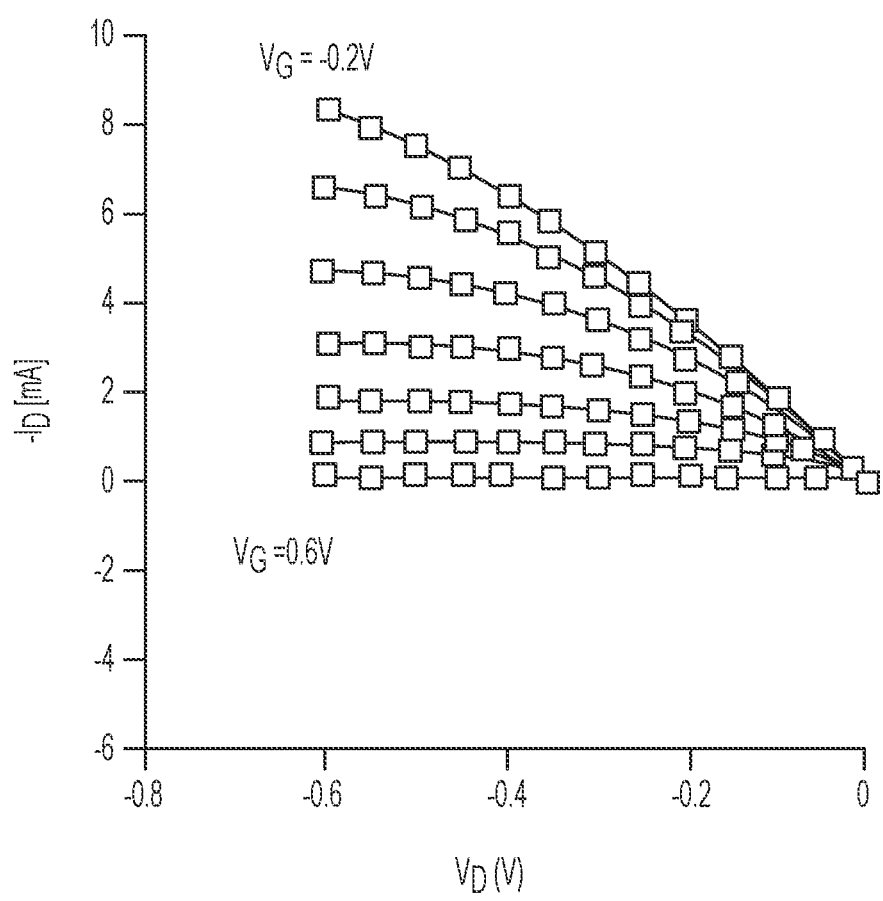
FIGS. 5A and 5B show the output curves for an ECT with channel dimensions of 100 µm×10 µm in accordance with some embodiments.
Figure 5B:
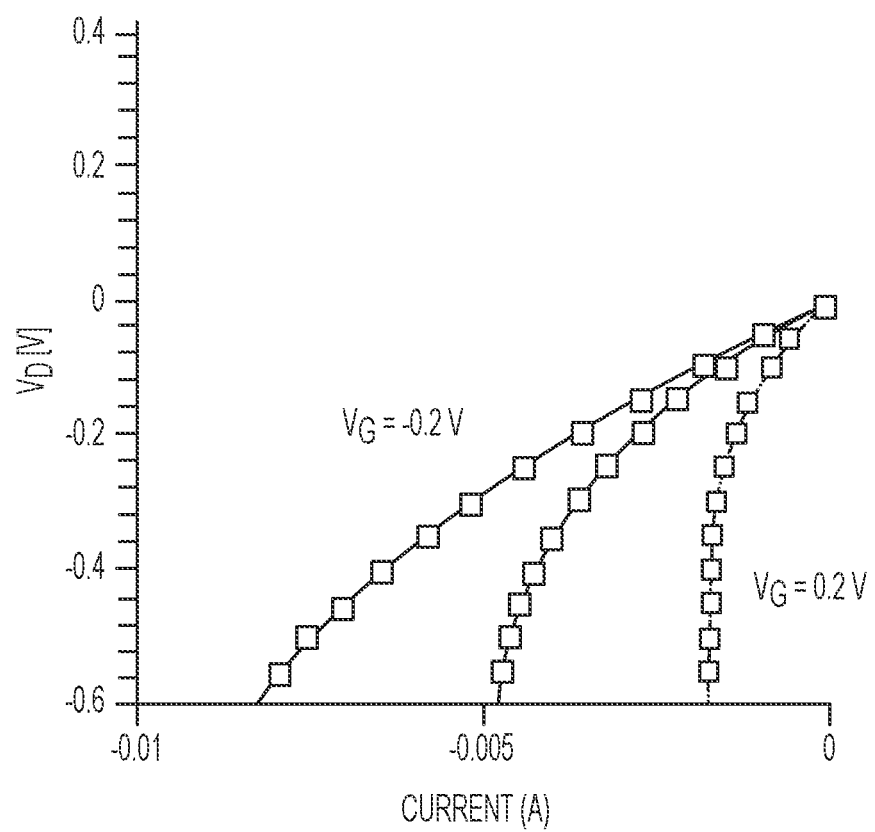
Figure 5C:
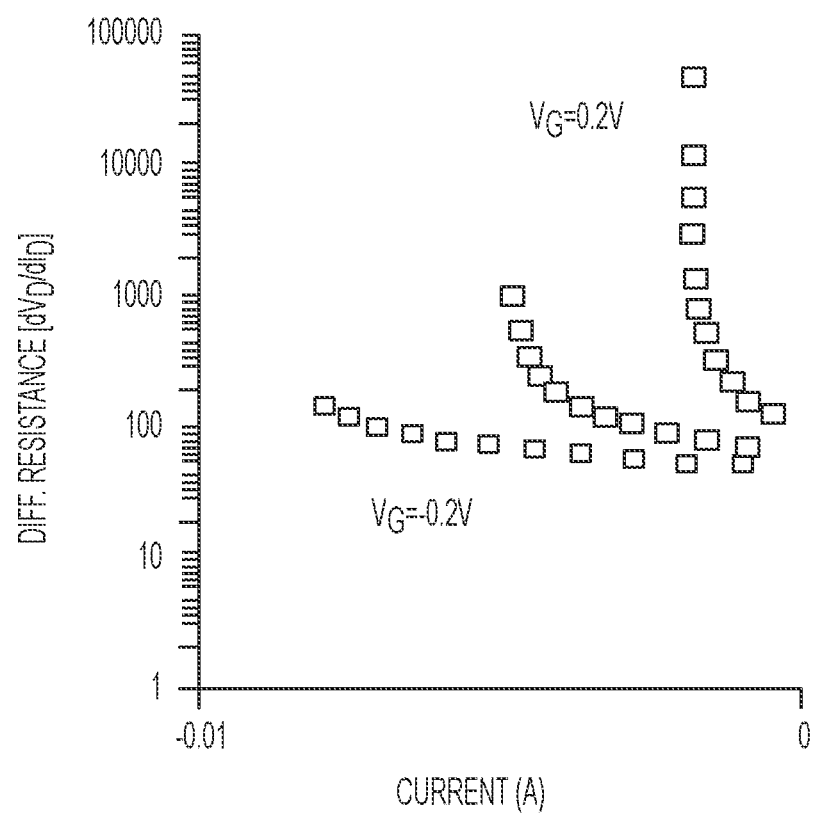
FIG. 5C shows the differential resistance ($dV_D/dI_D$) of the ECT as a function of channel current and gate voltage for the same device as in FIGS. 5A and 5B.

FIG. 5A shows the output curves for an ECT with channel dimensions of 100 µm×10 µm illustrating that at $V_D$=−0.6 V as $V_G$ changes from −0.2 V to 0.6 V the magnitude of the drain current ID decreases from about 8 mA at $V_G$=−0.2 V to about zero at $V_G$=0.6 V. FIG. 5B shows the output curves for the same transistor with the axes swapped and at a different scale to highlight the current limiting behavior of these ECT devices. FIG. 5C shows the differential resistance ($dV_D/dI_D$) of the ECT as a function of channel current and gate voltage for the same device as in FIGS. 5A and 5B. The cut-off current (the current at which the resistance sharply increases) can be tuned by changing the device dimensions and gate voltage.

Figure 6A:
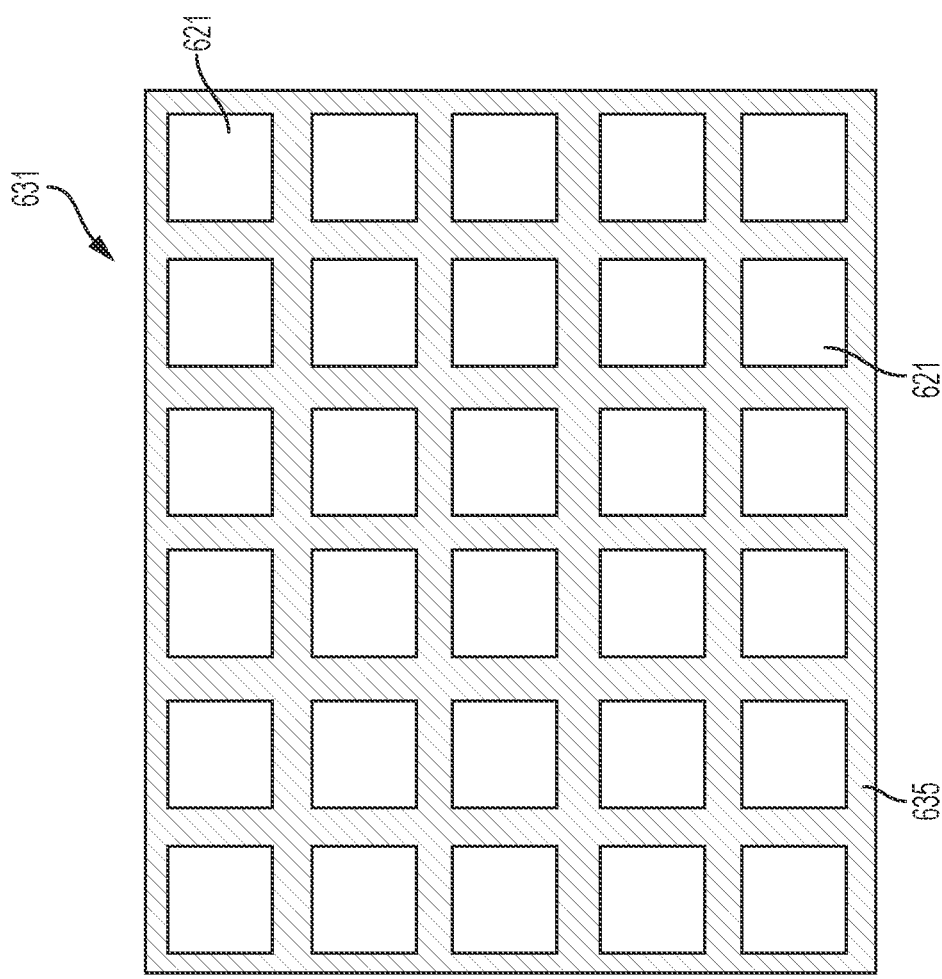
FIGS. 6A and 6B illustrate top and side views, respectively, of a current limiter in accordance with some embodiments.
Figure 6B:
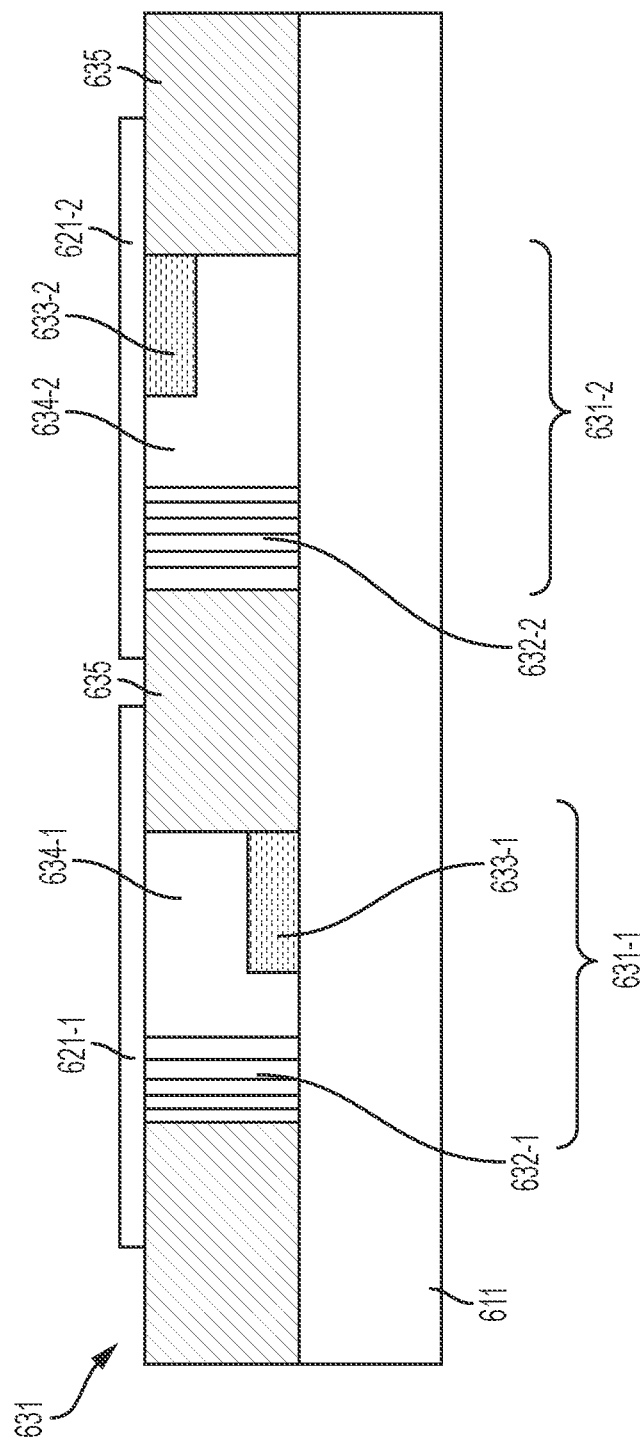
Figure 6C:
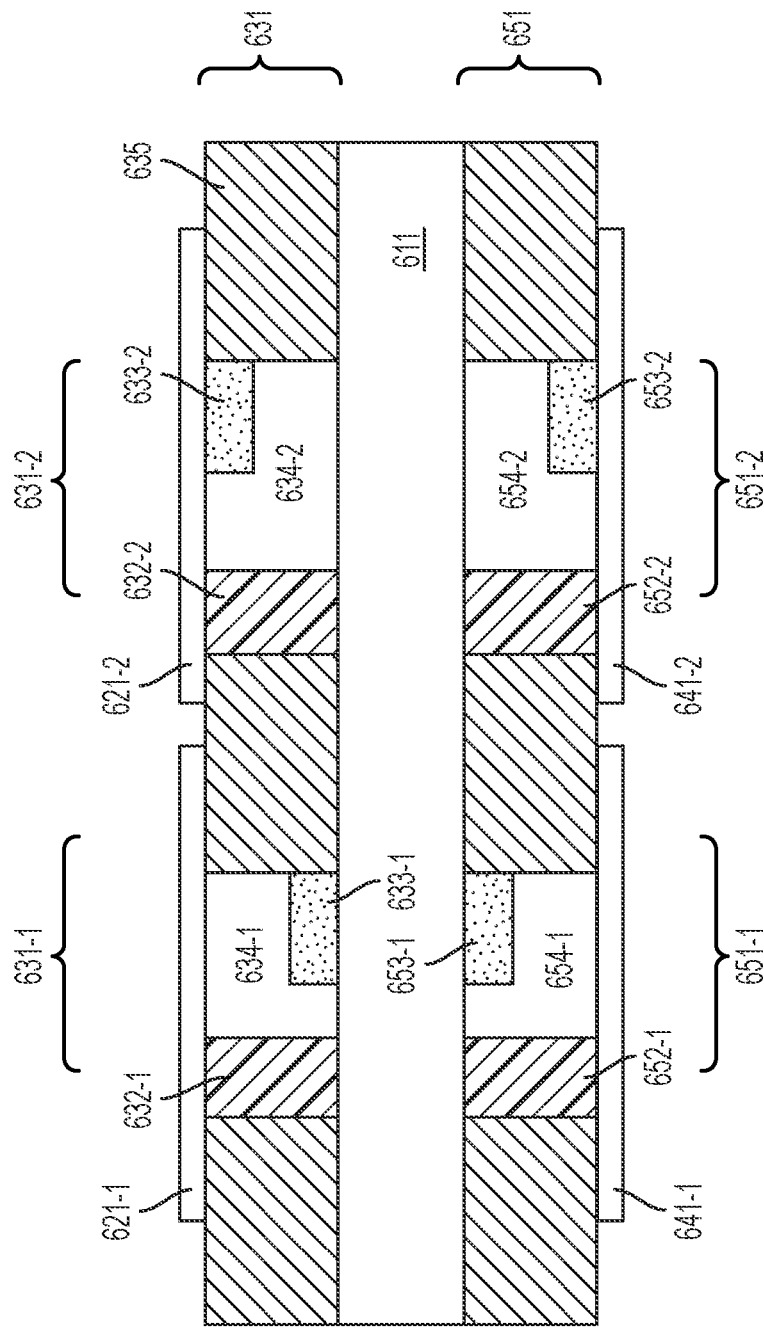
FIG. 6C illustrates a side view of a current limiter in accordance with some embodiments.

According to some embodiments, the current limiter comprises an array of ECTs printed or otherwise deposited onto a current-carrying metal foil. FIGS. 6A, 6B, and 6C illustrate top, side, and side views, respectively, of a current limiter 631 in accordance with some embodiments. FIG. 6A shows a top view of the current limiter 631 along with the patterned electrically conductive layer 621 of an energy device. For example, conductive layer 621 may correspond to element 121 of FIGS. 1-2, element 222 of FIG. 2, or element 321 of FIG. 3. Although not shown in FIGS. 6A, 6B, or 6C, the active material of the energy device (see e.g., element 125 of FIGS. 1-2 and elements 323-325 of FIG. 3)

would be deposited on the patterned electrically conductive layer and the current limiter 631 would limit the current through the active material of the energy device.

As best seen in FIG. 6B, the current limiter 631 includes ECTs 631-1, 631-2 that share a common current collector layer 611 in contact with the channel 632-1, 632-2. For example, the current collector layer 611 may serve as the drain of the ECTs 631-1, 631-2. The current collector layer 611 can be a current-carrying metal foil which serves to collect current from the energy device. The other electrode in contact with the ECT channel (e.g., the source electrode of the ECT) is a patterned layer comprising conductive pads 621-1, 621-2 which form discrete spaced apart regions. The pads 621-1, 621-2 may be disposed on insulator 635 such that each pad 621-1, 621-2 is electrically isolated from other pads 621-2, 621-1. Thus, in some configurations the channel 632-1, 632-2 of each ECT 631-1, 631-2 is electrically coupled to a respective contact pad 621-1, 621-2 at one end of the channel 632-1, 632-2 and to the common current collector layer 611 at the other end of the channel 632-1, 632-2. The gate electrode 633-1, 633-2 of the ECT 631-1, 631-2 can be shorted to either end of the channel 632-1, 632-1, e.g., to the common current collector layer 611 (drain) or to the pads 621-1, 621-2 (source). In embodiments that include a gate electrode shorted to either the drain or source electrode, the electrode to which the gate is shorted dictates which direction that the current is limited. The gate 633-1, 633-2 of the ECT 631-1, 631-2 is electrically coupled to the electrolyte 634-1, 634-2 such that the voltage at the gate 633-1, 633-2 controls the doping level in the channel 632-1, 632-2 and thus the current flow through the ECT 631-1, 631-2 as discussed above.

FIG. 6B illustrates a scenario in which the gate of a first ECT 631-1 is electrically connected to the common current collector layer 611 and the gate of a second ECT 631-2 is electrically connected to a contact pad 621-2. FIG. 6B represents a possible configuration for the current limiter, however, it will be appreciated that in alternate configurations the gate of each ECT in the array may be electrically connected to the common current collector layer or the gate of each ECT in the array may be connected to a respective contact pad. Furthermore, it will be appreciated that current limiters 631, 651 can be present on both sides of the common current collector layer 611 as shown in FIG. 6C. Each of the current limiters 631, 651 function in the manner described above, where elements 651-1, 651-2 correspond to elements 631-1, 631-2, elements 641-1, 641-2 correspond to elements 621-1, 621-2, elements 652-1, 652-2 correspond to elements 632-1, 632-2, elements 653-1, 653-2 correspond to elements 633-1, 633-2, and elements 654-1, 654-2 correspond to elements 634-1, 634-2.

Figure 7A:
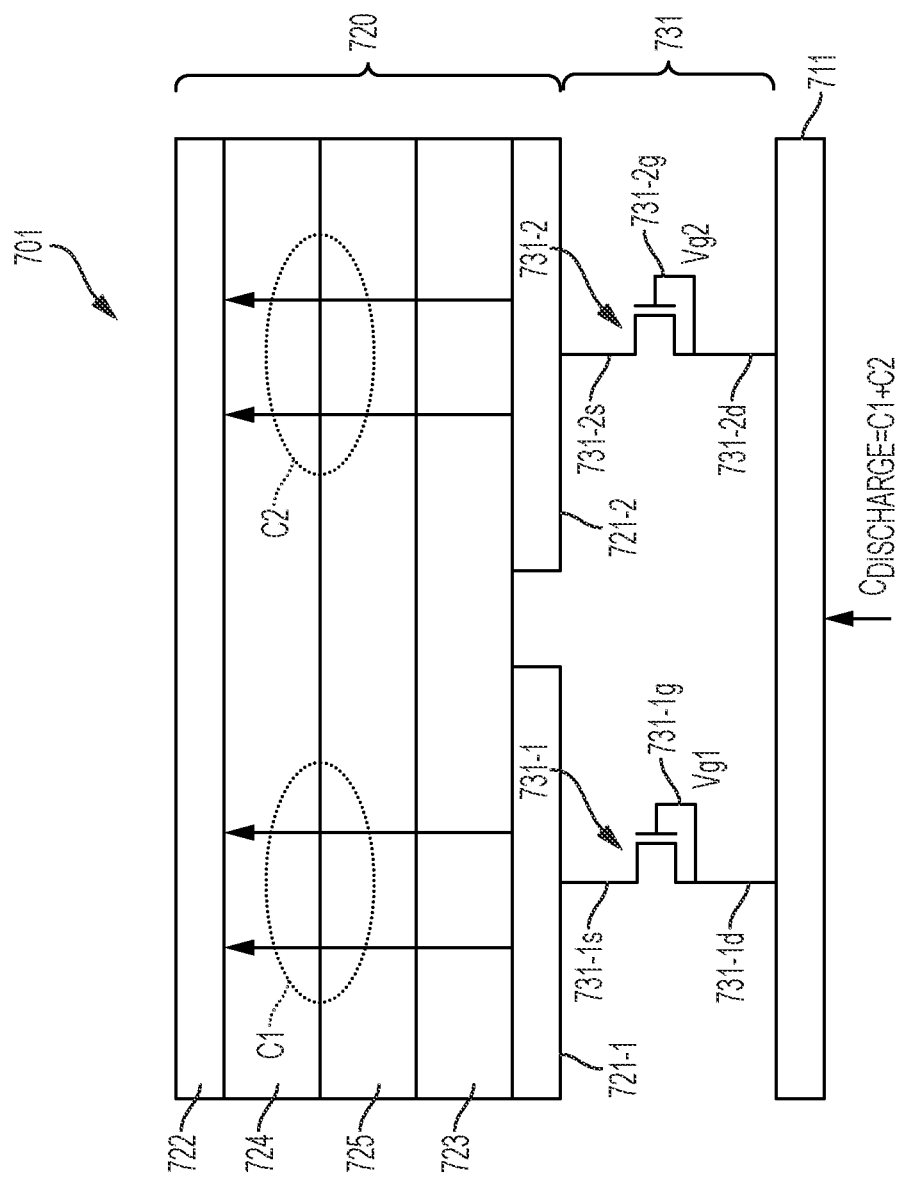
FIGS. 7A through 7D show several possible configurations of systems that include one or two current limiters in accordance with various embodiments.
Figure 7B:
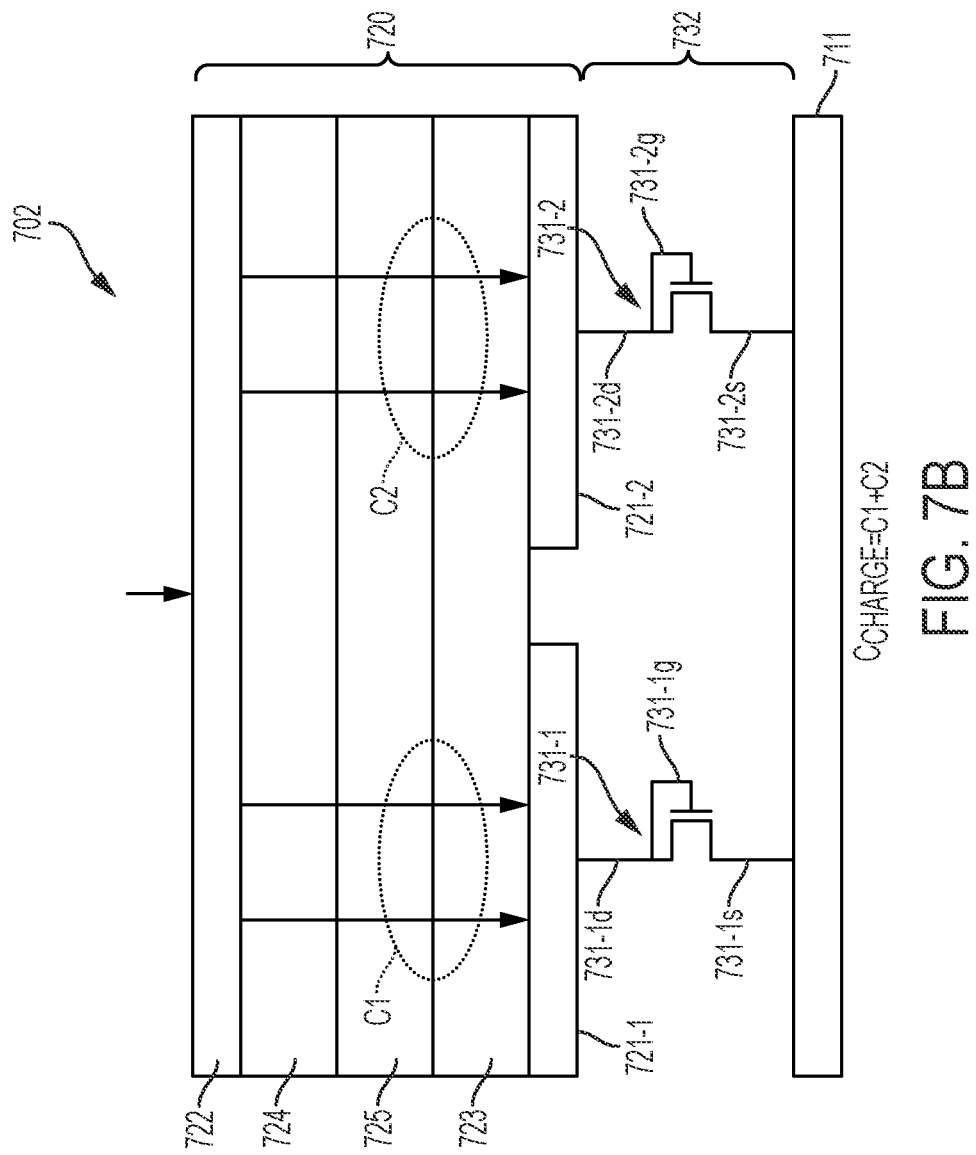

In some embodiments, the system may include only one current limiter comprising an ECT array electrically connected through an electrically conductive layer to the negative electrode (anode during discharge) of the battery or other energy device. In some embodiments, the system may include only one current limiter electrically connected through an electrically conductive layer to the positive electrode (cathode) of the energy device. In some embodiments the system may include a first current limiter electrically connected through an electrically conductive layer to the negative electrode of the energy device and a second current limiter electrically connected through an electrically conductive layer to the positive electrode of the energy device. FIGS. 7A through 7D illustrate configurations for systems that include one or two current limiters in accordance with various embodiments. As shown in FIGS. 7A through 7D, the current limiter discussed herein can be directly used with existing battery manufacturing process lines in several possible configurations. The ECTs can be deposited at the negative electrode (e.g., anode) of the energy device, the positive electrode (e.g., cathode) of the energy device, or at both the negative and positive electrodes. The gate electrode can be shorted to either the common current collector layer or the conductive pads in contact with the battery electrodes, depending on the ECT carrier type (n-type or p-type) and on which direction the current is to be limited. FIGS. 7A through 7D show several possible configurations of systems that include one or two current limiters although additional permutations are possible. For example, FIGS. 7A and 7B depict systems 701, 702 that include a current limiter at the negative electrode of the energy device to limit the discharge (FIG. 7A) and charging current (FIG. 7B), respectively. By limiting the discharge current flowing through the negative electrode of a lithium-ion battery, the rate of self-discharge during an internal short-circuit can be decreased. On the other hand, by limiting the charging current through the negative electrode of a lithium-ion battery, the lithium plating and the formation of lithium dendrites can be suppressed, which decreases the likelihood of an internal short-circuit.

Figure 7C:
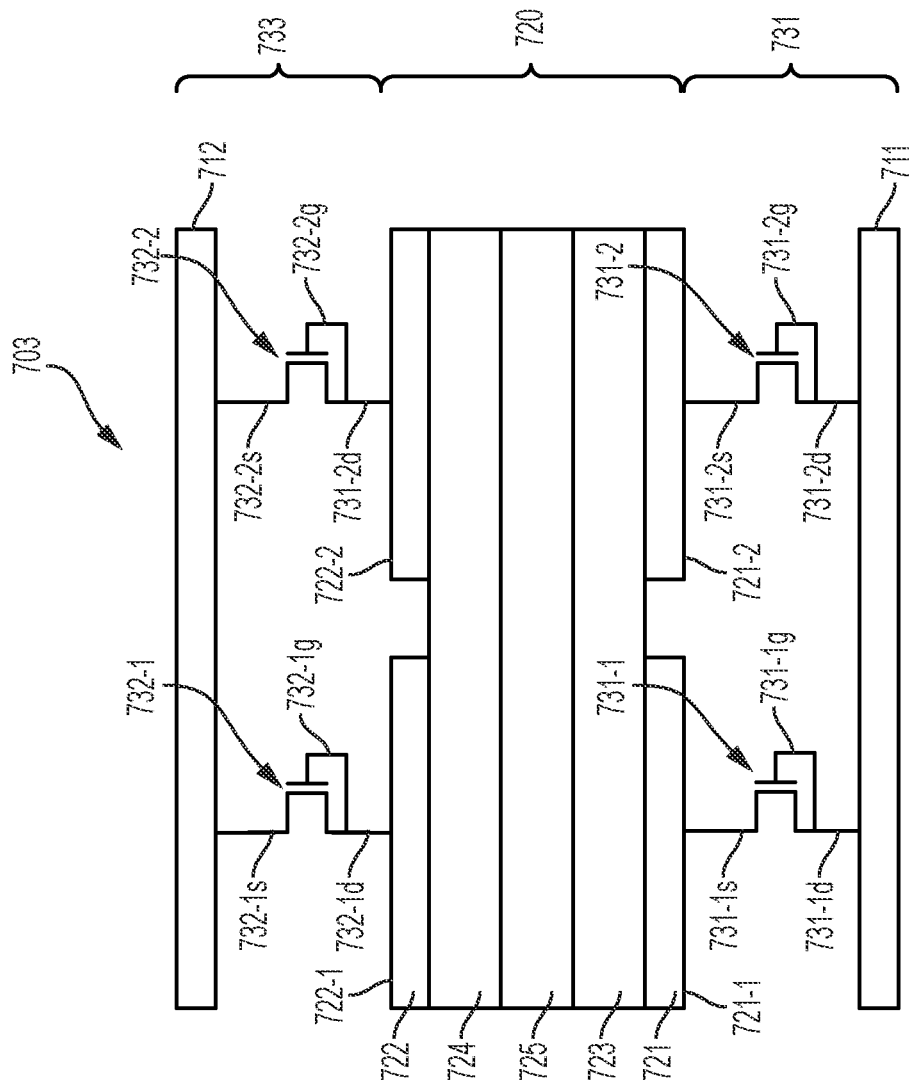
Figure 7D:
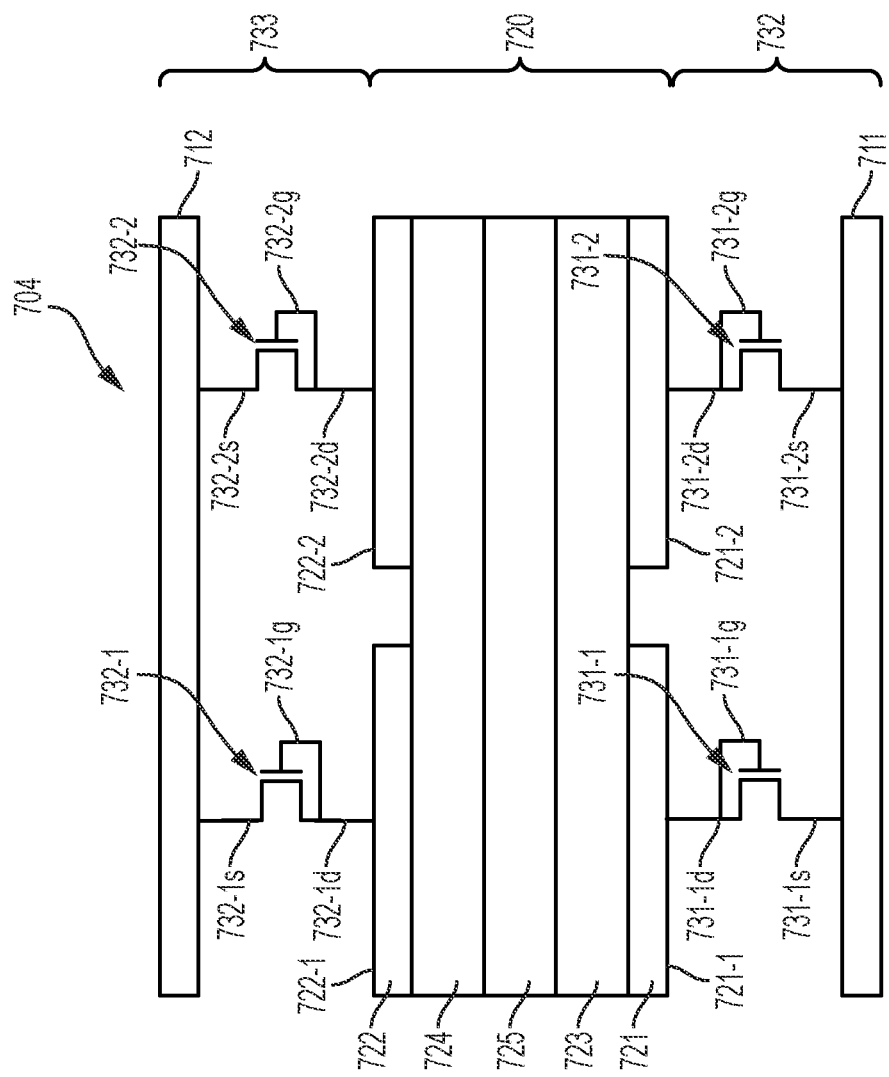

Enhanced design flexibility can be achieved by alternatively or additionally incorporating current limiters at the positive electrode of the energy device as shown in the systems 703, 704 depicted in FIGS. 7C and 7D. For example, FIG. 7C depicts a system 703 where discharge current through both the positive and negative electrodes is limited, which would further reduce the rate of self-discharge during an internal short-circuit. Alternately, the limiting current directions can oppose each other as shown in the system 704 of FIG. 7D, so the negative electrode limits the charging current while the positive electrode limits the discharging current. Numerous other permutations and combinations of current limiters based on ECTs are possible.

FIGS. 7A through 7D show systems 701, 702, 703, 704 that include one or two current limiters 731, 732, 733 and an energy device 720 that is illustrated as a battery. Each current limiter 731, 732, 733 includes an array of ECTs, shown as 731-1 and 731-2 or 732-1 and 732-2, which are p-type in this embodiment but could alternatively be n-type. The battery 720 comprises an electrolyte 725 disposed between a negative electrode (anode) 723 and a positive electrode (cathode) 724. In FIGS. 7A and 7B, a substantially continuous electrically conductive layer 722 is disposed on the positive electrode 724 of the battery 720 and a layer 721 comprising an array of electrically conductive pads 721-1, 721-2 is disposed on the negative electrode 723. In FIGS. 7C and 7D, a layer 722 comprising an array of electrically conductive pads 722-1, 722-2 is disposed on the positive electrode 724 of the battery and a conductive layer 721 comprising an array of electrically conductive pads 721-1, 721-2 is disposed on the negative electrode 723.

FIG. 7A shows system 701 that includes current limiter 731 comprising ECTs 731-1, 731-2. In the system 701 of FIG. 7A, the current limiter 731 controls the discharging current flowing from the common current collector 711 to the negative electrode 723 (anode) of the battery 720. ECTs 731-1, 731-2 include a first electrode 731-1d, 731-2d (e.g., a drain electrode), a second electrode 731-1s, 731-2s (e.g., a source electrode), and a control electrode 731-1g, 731-2g (e.g., a gate electrode). The first electrodes 731-1d, 731-2d of each ECT 731-1, 731-2 are electrically coupled to the common current collector layer 711. The second electrodes 731-1s, 731-2s of each ECT 731-1, 731-2 are respectively coupled to a corresponding contact pad 721-1, 721-2 of the battery 720 (or other energy device). The contact pads 721-1, 721-2 electrically connect the second electrodes 731-1s, 731-2s of each ECT 731-1, 731-2 to the negative electrode 723 (anode) of the battery 720 (or other energy device). The gate electrodes 731-1g, 731-2g are electrically connected to first electrode 731-1d, 731-2d in this embodiment.

With this arrangement, ECT 731-1 is designed such that it is in the on state when the gate 731-1g is electrically connected to the drain 731-1d. If the magnitude of localized current C1 from the battery 720 passing from collection plate 711 to contact pad 721-1 is small, the ECT 731-1 operates in the linear regime and acts as a low-resistance resistor. However, if a hot-spot or other undesirable current spike occurs and causes C1 to increase above a designed value, the ECT 731-1 will enter saturation mode and its differential resistance will dramatically increase (see, e.g., FIG. 5C). This, in turn, causes the localized current C1 to decrease back to acceptable values.

Similarly, ECT 731-2 is designed such that it is in the on state when the gate 731-2g is electrically connected to the drain 731-2d. If the magnitude of localized current C2 from the battery 720 passing from collection plate 711 to contact pad 721-2 is small, the ECT 731-2 operates in the linear regime and acts as a low-resistance resistor. However, if a hot-spot or other undesirable current spike occurs and causes C2 to increase above a designed value, the ECT 731-2 will enter saturation mode and its differential resistance will dramatically increase (see, e.g., FIG. 5C). This, in turn, causes the localized current C2 to decrease back to acceptable values.

The current collector 711 can be implemented by a metal-containing film or other conductive material, e.g., aluminum, carbon/graphite, copper, gold, silver, indium tin oxide (ITO) or other conductive oxide, etc. that facilitates the combination of localized currents C1 to C2 such that the sum of these currents form the current $C_{DISCHARGE}$.

FIG. 7B shows a system 702 that includes current limiter 732 comprising ECTs 731-1, 731-2. In the system 702 of FIG. 7B, the current limiter 732 controls the charging current from the negative electrode 723 (anode) of the battery 720 to the common current collector 711. ECTs 731-1, 731-2 include a first electrode 731-1d, 731-2d (e.g., a drain electrode), a second electrode 731-1s, 731-2s (e.g., a source electrode), and a gate electrode 731-1g, 731-2g. In current limiter 732, the second electrodes 731-1s, 731-2s of each ECT 731-1, 731-2 are electrically coupled to the common current collector electrode 711. The first electrodes 731-1d, 731-2d of each ECT 731-1, 731-2 are respectively coupled to a corresponding contact pad 721-1, 721-2 of the battery 720 (or other energy device). The gate electrodes 731-1g, 731-2g are electrically connected to first electrode 731-1d, 731-2d.

The current collector 711 facilitates the combination of localized currents C1 to C2 such that the sum of these currents form the current $C_{CHARGE}$.

FIG. 7C shows system 703 that includes current limiter 731 as in FIG. 7A and current limiter 733. System 703 is arranged such that the energy device 720 is disposed between and is electrically connected to the first current limiter 731 and the second current limiter 733. In the system 703, the first current limiter 731 controls the discharging current from the common current collector 711 to the negative electrode 723 (anode) of the battery. The second current limiter 733 controls the discharging current from the positive electrode 724 (cathode) of the battery 720 to the common current collector 712.

The second current limiter 733 comprises ECTs 732-1, 732-2. ECTs 732-1, 732-2 include a first electrode 732-1d, 732-2d (e.g., a drain electrode), a second electrode 732-1s, 732-2s (e.g., a source electrode), and a gate electrode 732-1g, 732-2g. The second electrodes 732-1s, 732-2s of each ECT 732-1, 732-2 of the second current limiter 733 are electrically connected to the common current collector electrode 712. The first electrodes 732-1d, 732-2d of each ECT 732-1, 732-2 of the second current limiter 733 are respectively coupled to a corresponding contact pad 722-1, 722-2 of the battery 720 (or other energy device). Each gate electrode 732-1g, 732-2g of the ECTs 732-1, 732-2 of the second current limiter 733 is respectively electrically connected to the first electrode 732-1d, 732-2d of the ECTs 732-1, 732-2 of the second current limiter 733.

System 704 shown in FIG. 7D includes current limiter 732 as in FIG. 7B and current limiter 733 as in FIG. 7C. In system 704 the current limiting directions of the first and second ECT arrays 732, 733 oppose each other. System 704 is arranged such that the energy device 720 is disposed between and is electrically connected to current limiter 732 and current limiter 733. In the system 704, the first current limiter 732 controls the charging current from the negative electrode 723 (anode) of the battery 720 to the common current collector 711. The second current limiter 733 controls the discharging current from the positive electrode 724 (cathode) of the battery 720 to common current collector 712.

When a current is drawn from or forced into a battery, the current distributes over each electrode according to the resistance between each point on the current collector and the edge of the batteries. Occasionally, manufacturing defects or other inhomogeneity can lower the resistance to current flow at a particular spot on the current collector leading to a current hot spot. At best, this current hot-spot can lead to decreased cell capacity as the cell is degraded near the current hot spot. At worst, current hot-spots can lead to filament formation and thermal runaway. If a short forms in the battery for any reason, the entire battery capacity can be rapidly discharged through the short, leading to overheating and fire. In a battery cell equipped with a current limiter as disclosed herein, current hot-spots are suppressed by the current-limiting nature of ECTs. Furthermore, in the case of a catastrophic internal short, the ECTs slow the rate of self-discharge through the short, allowing for graceful battery shutdown.

Figure 8:
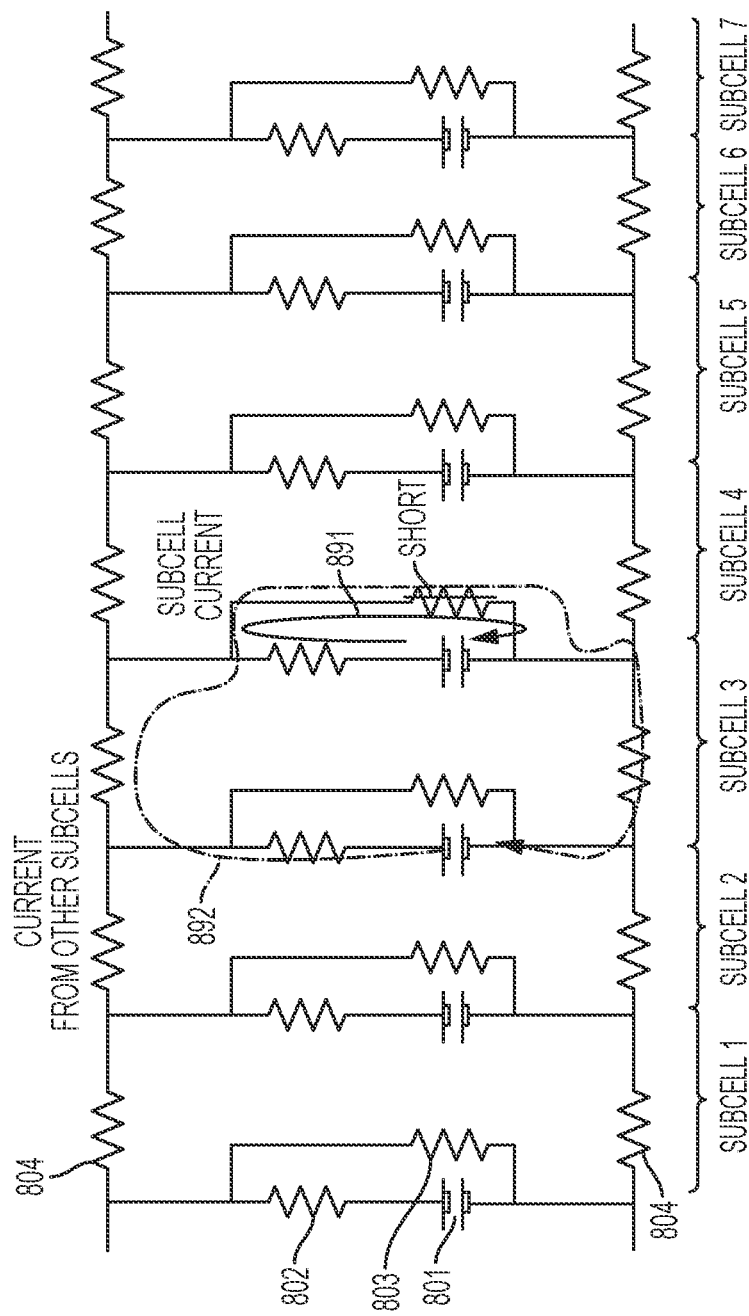
FIG. 8 provides a distributed model for a conventional battery comprising seven subcells or regions.

FIG. 8 is a distributed model for a conventional battery comprising seven subcells or regions. Each battery subcell is modeled by a voltage source 801, series resistance 802, shunt resistance 803 (very high for an ideal subcell), and electrode resistances 804. FIG. 8 depicts a short in subcell 4 such that the shunt resistance for subcell 4 is very low. Path 891 indicates the current flow from subcell 4 through the short. Path 892 indicates the current flow from adjacent subcell 3 through subcell 4 due to the short. In a conventional battery, as illustrated in FIG. 8, internal shorts can allow the battery capacity to rapidly discharge through the short.

Figure 9:
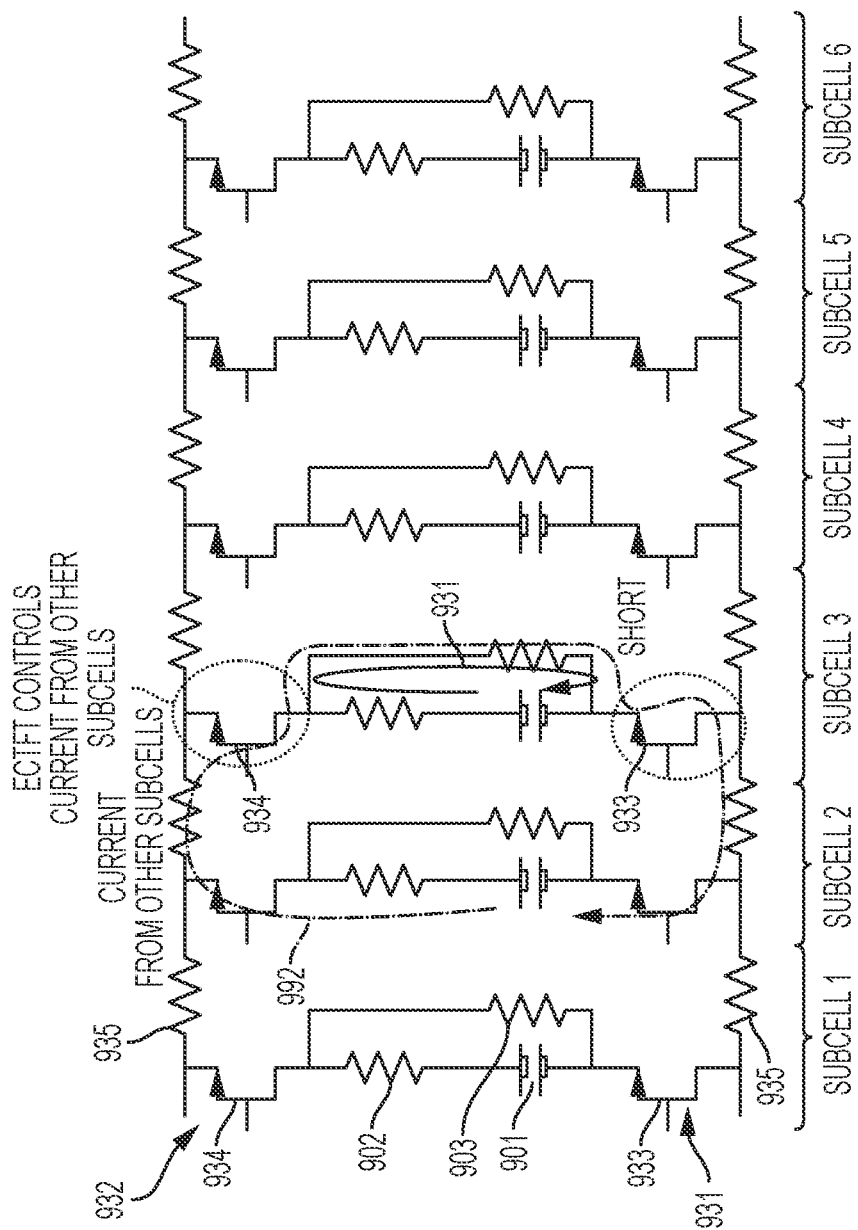
FIG. 9 is a distributed model for a system comprising a battery and first and second current limiters in accordance with some embodiments.

FIG. 9 is a distributed model for a system comprising a battery and first and second current limiters in accordance with some embodiments. Six subcells of the battery are depicted in FIG. 9. Each battery subcell is modeled by a voltage source 901, series resistance 902, shunt resistance 903 (very high for an ideal subcell), and electrode resistances 935. Current limiters 931, 932 comprising ECTs 933, 934 and current collectors represented by resistors 935 are disposed at opposite electrodes of the battery. FIG. 9 depicts a short in subcell 3 such that the shunt resistance for subcell 3 is very low. Path 992 indicates the current flow from subcell 2 through the short indicating that the current flow from adjacent subcell 2 through subcell 3 is controlled by the ECTs 933, 934 of subcells 2 and 3. By adding ECTs to limit the current flow through any particular region of current collector, the current from other sub-cells that travels through the ECTs is limited, and graceful battery shutdown is possible.

Figure 10A:
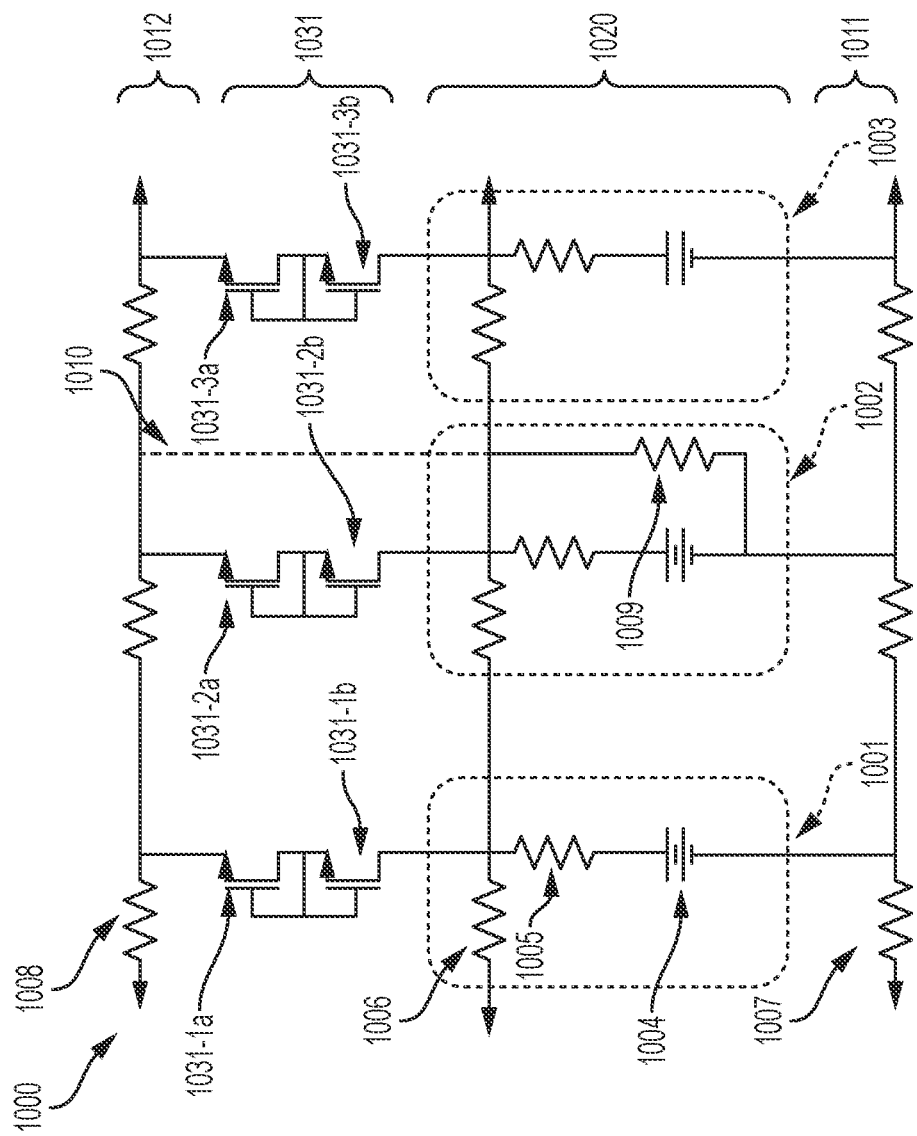
FIG. 10A shows the distributed equivalent circuit for a system comprising three subcells (regions) of a battery disposed between a current limiter and a current collector that was used for modeling.
Figure 10B:
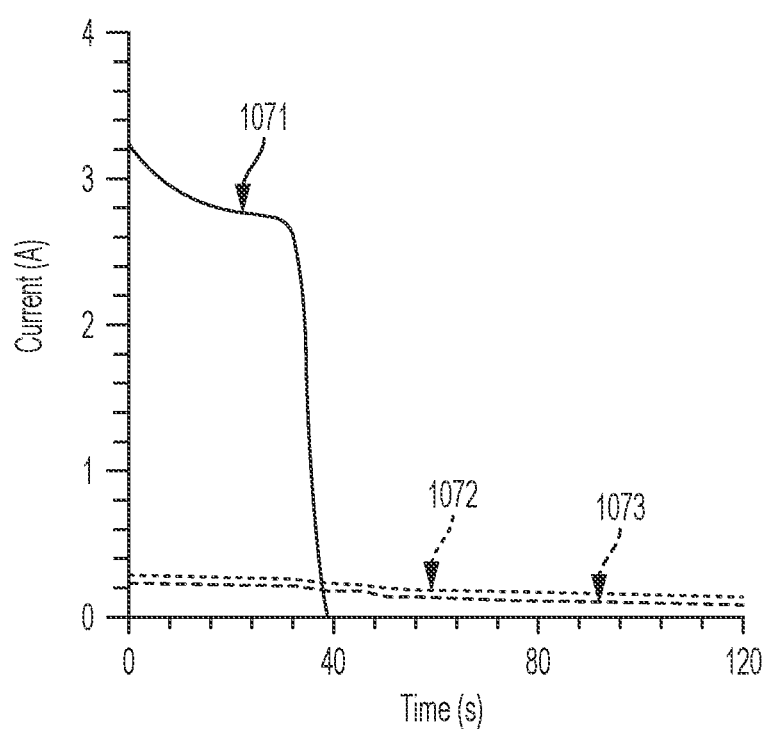
FIG. 10B plots the current through internal and external short-circuits obtained from modeling the battery circuit in FIG. 10A.
Figure 10C:
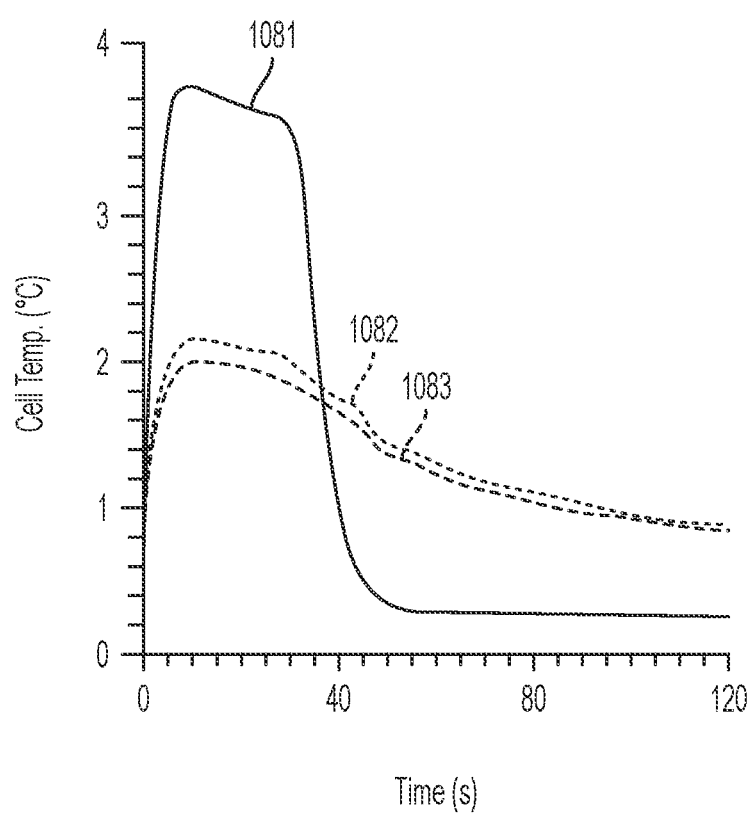
FIG. 10C plots the cell temperature after introducing an internal or external short-circuit obtained from modelling the battery circuit shown in FIG. 10A.

A SPICE simulation was performed using an equivalent circuit model for a system 1000 comprising current limiter 1031 and battery 1020 shown in FIG. 10A. The simulations indicate that a current limiter comprising ECTs can inhibit current flow from neighboring subcells in the event of a shorted or low resistance battery subcell. FIG. 10B illustrates the simulated current flowing through the short-circuit as a function of time for batteries without a current-limiter (plot 1071), with a current-limiter under internal short-circuiting (plot 1072), and with a current-limiter under external short-circuiting (plot 1073). FIG. 10C illustrates the simulated temperature as a function of time for batteries without a current-limiter (plot 1081), with a current-limiter under internal short-circuiting (plot 1082), and with a current-limiter under external short-circuiting (plot 1083). Both the current through the short-circuit and the maximum battery temperature are greatly reduced if one or more ECTs are present to limit the flow of current from adjacent subcells through the short-circuit.

FIG. 10A shows a portion of the distributed equivalent circuit for the system 1000 comprising three sub-cells 1001, 1002, 1003 (regions) of battery 1020 disposed between a current limiter 1031 and current-collector 1011. The full distributed equivalent circuit model consists of 100 sub-cells, with sub-cells 1001, 1002, and 1003 being the $49^{th}$, $50^{th}$, and $51^{st}$ sub-cells, respectively. Each subcell represents a battery region of 1 mm in width and 1 cm in length, so the total footprint of the simulated battery is 10 cm². Each sub-cell of the battery was modeled as a variable-voltage source 1004 and a 130 Ω series resistance 1005. Adjacent sub-cells were connected with a 12 Ω resistance 1006. The variable voltage sources 1004 start with an output voltage of 4.2 V, with the voltage decreasing as charge is passed. Once 1 C of charge is passed through each voltage source 1004, the voltage output of the element drops to 0 V. This behavior mimics the behavior of batteries, which output less voltage as they become discharged. The series resistance 1005 represents ionic and kinetic losses during the cell discharge, and the resistance 1006 represents conduction along the positive electrode material. The sub-cells 1001, 1002, 1003 are electrically connected to a common current-collector 1011, which is represented by 0.3 mΩ resistors 1007. The current limiter 1031 is comprised of a first pair of ECTs 1031-1a/b associated with the battery sub-cell 1001, a second pair of ECTs 1031-2a/b associated with the battery sub-cell 1002, and a third pair of ECTs 1031-3a/b associated with the battery sub-cell 1003. Each pair of ECTs is connected in series (see, e.g., FIG. 25) and functions as described herein. The current limiter 1031 is disposed between the battery 1020 and a common current-collector 1012, which is represented by 0.3 mΩ resistors 1008. A 10 mΩ resistor 1009 represents a short-circuit that can be formed by a dendrite, manufacturing defect, mechanical damage, etc. When wire 1010 is connected, the short-circuit is an external short-circuit, while in the absence of wire 1010 the short is an internal short-circuit. The current through the entire distributed circuit was simulated as a function of time with a SPICE simulation, and the heat dissipation in each circuit element was fed into a COMSOL thermal model to estimate the maximum cell temperature as a function of time. This set of simulations was performed with an internal short-circuit (wire 1010 missing), an external short circuit (wire 1010 present), and a short-circuit without a current-limiter present (each ECT 1031-1a/b, 1031-2a/b, 1031-3a/b replaced with a wire).

The results of the modeling are represented in graphs 10B and 10C that plot the simulated current that passes through short-circuit 1009 and the simulated maximum battery temperature as a function of time, respectively. Simulated current passing through the short-circuit 1009 in the absence of a current-limiter during a short-circuit and maximum battery temperature in the absence of a current-limiter during a short-circuit are represented as solid lines 1071, 1081 in FIGS. 10B and 10C, respectively. Simulated current passing through the short-circuit 1009 in the presence of a current-limiter during an internal short-circuit and simulated maximum battery temperature in the presence of a current-limiter during an internal short-circuit are represented as dotted lines 1072, 1082 in FIGS. 10B and 10C, respectively. Simulated current passing through the short-circuit 1009 in the presence of a current-limiter during an external short-circuit and simulated maximum battery temperature in the presence of a current-limiter during an external short-circuit are represented as dashed lines 1073, 1083 in FIGS. 10B and 10C, respectively.

It will be appreciated from the graph of FIG. 10B that the presence of ECTs 1031-1a/b, 1031-2a/b, 1031-3a/b significantly decreases the current that flows through short-circuit 1009. It will also be appreciated from the graph of FIG. 10C that the presence of ECTs 1031-1a/b, 1031-2a/b, 1031-3a/b significantly decreases the maximum cell temperature that is obtained under both internal and external short-circuit conditions. Furthermore, the output voltage of the battery under moderate current load in the absence of short-circuit 1009 is negligibly effected by the presence of current-limiter 1031 (<20 mV decrease).

Figure 11:
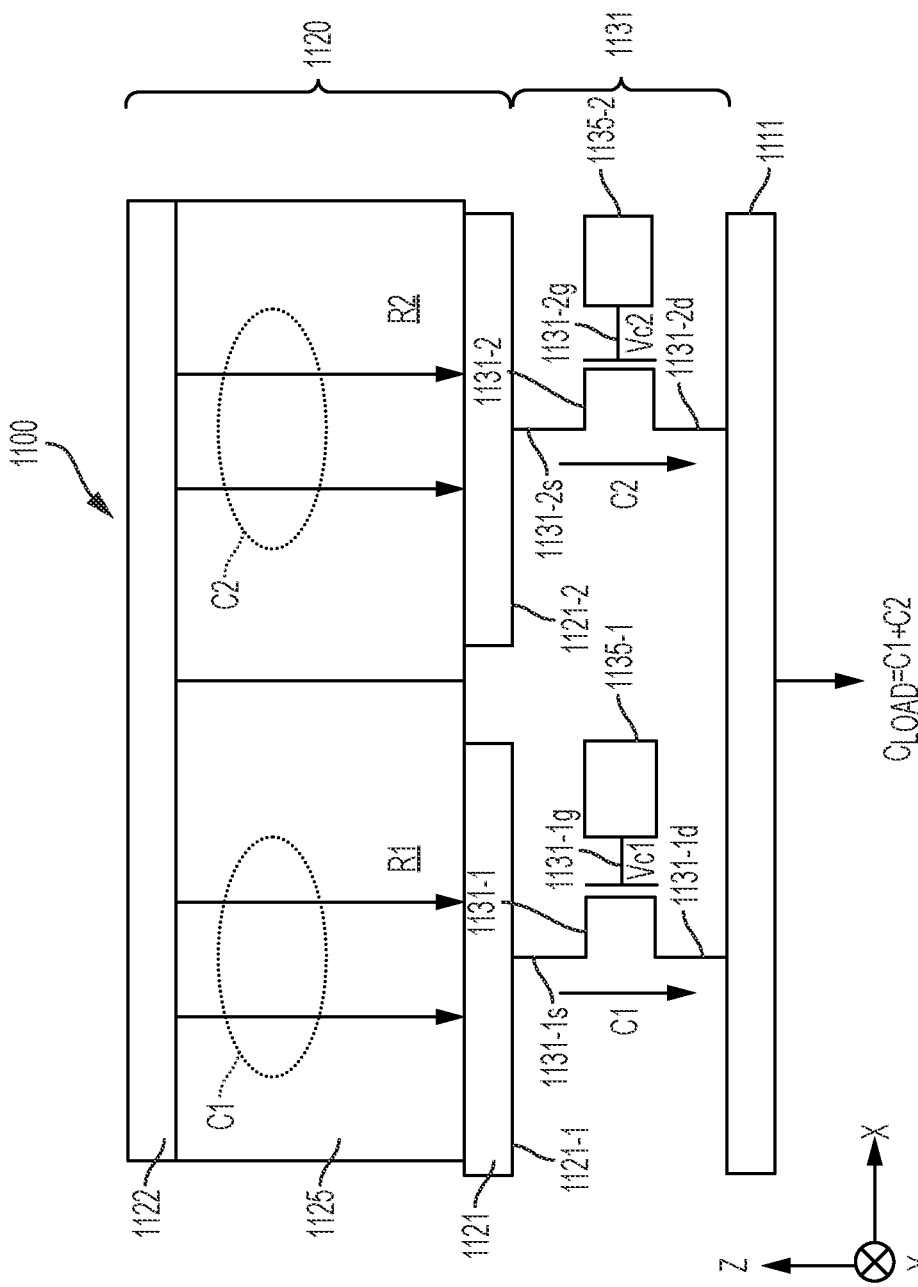
FIG. 11 illustrates a system that includes array of ECTs that are operably connected between a current collector and multiple discrete contact pads.

In some embodiments, the ECTs used in the current limiters discussed herein can be passively controlled (as illustrated, for example, in FIGS. 7A through 7D). In some embodiments, the ECTs used in current limiters can be actively controlled as illustrated in FIGS. 11 through 14. FIG. 11 illustrates a system 1100 that includes array of ECTs 1131-1, 1131-2 that are operably connected between a current collector 1111 and contact pads 1121-1, 1121-2 respectively. Specifically, ECT 1131-1 has a first electrode 1131-1d (e.g., drain electrode) connected to current collector 1111, a second electrode 1131-1s (e.g., source electrode) connected to associated contact pad 1121-1, and a control electrode 1131-1g (e.g., gate electrode) that receives an associated control signal Vc1. With this arrangement, ECT 1131-1 can be turned on, off, or set to an intermediate partially-on state by control voltage Vc1. For example, when control voltage Vc1 is below the threshold voltage of p-type depletion-mode ECT 1131-1, a localized current C1 from the energy device 1120 passes from contact pad 1121-1 to collection plate 1111, where current C1 is determined by the control voltage Vc1. For example, in some embodiments, C1 may be proportional to Vc1.

Similarly, ECT 1131-2 has a first electrode 1131-2d (e.g., drain electrode) connected to current collector 1111, a second electrode 1131-2s (e.g., source electrode) connected to associated contact pad 1121-2, and a control electrode 1131-2g (e.g., gate electrode) that receives an associated control signal Vc2. With this arrangement, ECT 1131-2 can be turned on, off, or set to an intermediate partially-on state by control voltage Vc2. For example, when control voltage Vc2 is below the threshold voltage of p-type depletion-mode ECT 1131-2, a localized current C2 from the energy device 1120 passes from contact pad 1121-2 to collection plate 1111, where current C2 is determined by the control voltage Vc2. For example, in some embodiments, C2 may be proportional to Vc2.

The current collector can be implemented by a metal or metal-containing film or other conductive material that facilitates the combination of localized currents C1 to C2 such that the sum of these currents form load current $C_{LOAD}$.

In some embodiments, the current limiter 1131 may include one or more components 1135-1, 1135-2 that control the voltage Vc1, Vc2 at the control electrode 1131-1g, 1131-2g of the ECTs 1131-1, 1131-2. FIG. 11 illustrates a current limiter comprising a distributed control system implemented using control subsystems 1135-1 and 1135-2. In some implementations the subsystems 1135-1, 1135-2 may be or include one or more sensors, such as current sensors and/or temperature sensors, configured to measure localized battery operating parameters in discrete battery regions R1, R2.

Figure 12:
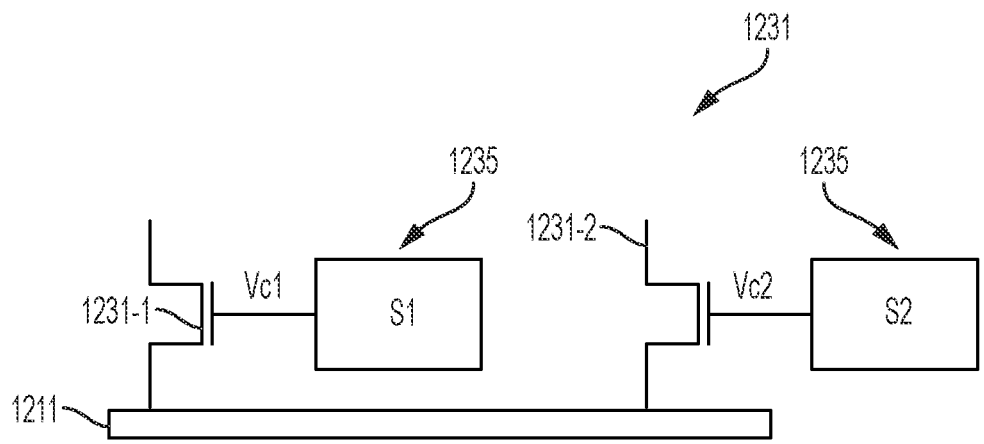
FIGS. 12 and 13 illustrate current limiters that utilize distributed control circuitry in accordance with some embodiments.
Figure 13:
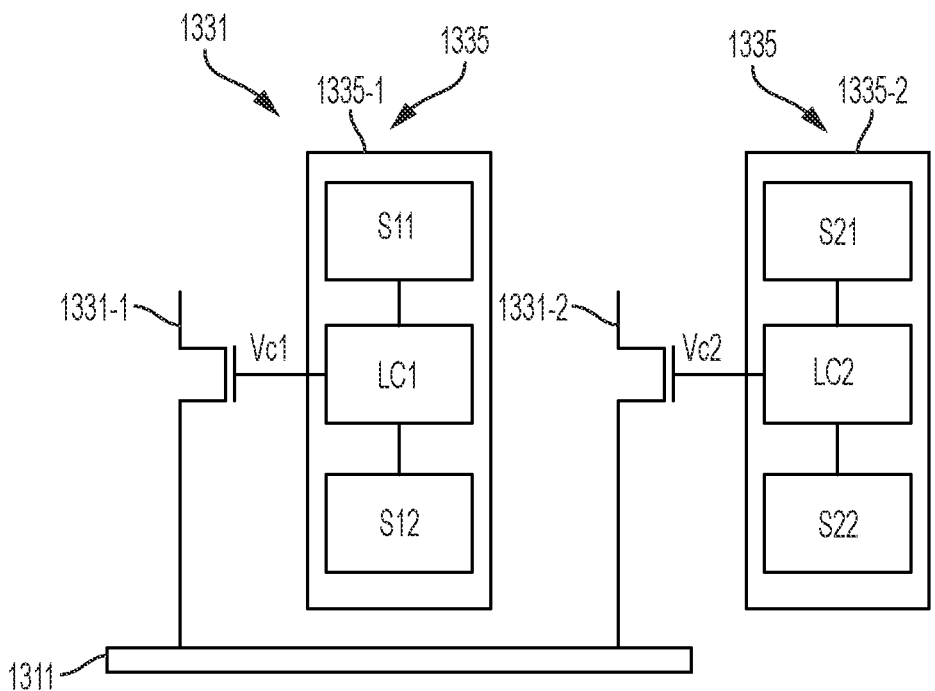

FIGS. 12 and 13 illustrate current limiters that utilize distributed control circuitry. FIG. 12 illustrates a current limiter 1231 having distributed control circuitry 1235 comprising multiple sensors S1, S2. The current limiter 1231 comprises an array of ECTs 1231-1, 1231-2 that have one electrode electrically coupled directly or indirectly to a common current collector 1211. One or more of the ECTs 1231-1, 1231-2 is controlled by a sensor. In the illustrated embodiment, the output of sensor S1 provides the control voltage Vc1 for the first ECT 1231-1 and the output of sensor S2 provides the control voltage Vc2 for the second ECT 1231-2. The sensors S1 and/or S2 may be configured to sense current, voltage, temperature, strain, chemistry, or any other parameter pertinent to operation of the energy device.

FIG. 13 illustrates another current limiter 1331 that includes distributed control circuitry 1335. The current limiter 1331 comprises an array of ECTs 1331-1, 1331-2 that have one electrode electrically coupled directly or indirectly to a common current collector 1311. Control circuitry 1335 comprises first circuitry 1335-1 that controls the operating state of ECT 1331-1 by controlling Vc1 and second circuitry 1335-2 that controls the operating state of ECT 1331-2 by controlling Vc2. Circuitry 1335-1, 1335-2 may comprise one or more sensors S11, S12, S21, S22 coupled to a local controller LC1, LC2 to control the operating states of ECTs 1331-1, 1331-2. Local controllers LC1, LC2 may generate control voltages Vc1, Vc2 based on a variety of information. In some embodiments, the local controllers LC1, LC2 generate control voltages Vc1, Vc2 based at least in part on localized sensor information from one or multiple sensors S11, S12, S21, S22. The local sensor information may indicate operating parameters of the energy device in some embodiments. For example, the sensor information may comprise one or more of temperature, concentration of a chemical substance, concentration of a biological substance, pH, humidity, ion concentration, electrical potential, current, resistance, impedance, capacitance, light intensity, stress, strain, pressure, etc. The sensors may be optical, resistive, or capacitive sensors, for example, and may be mounted on the contact pads, and/or within the interior of the battery or energy device.

In one example configuration, S11 and S21 are current sensors. S11 measures the current through ECT 1331-1 and S21 measures the current through ECT 1331-2. Local controller LC1 receives the sensed current value from S11 and compares the sensed current value to a stored current value. If the sensed current value exceeds the stored current value, LC1 adjusts Vc1 such that the current through ECT 1331-1 is reduced. Similarly, local controller LC2 receives the sensed current value from S21 and compares the sensed current value to a stored current value. If the sensed current value exceeds the stored current value, LC2 adjusts Vc2 such that the current through ECT 1331-2 is reduced.

In some embodiments, local controllers LC1, LC2 may use additional measured or calculated information about the battery, e.g., age of the battery, number of charge and discharge cycles, and/or state of charge of the battery to generate the voltages Vc1, Vc2.

Figure 14:
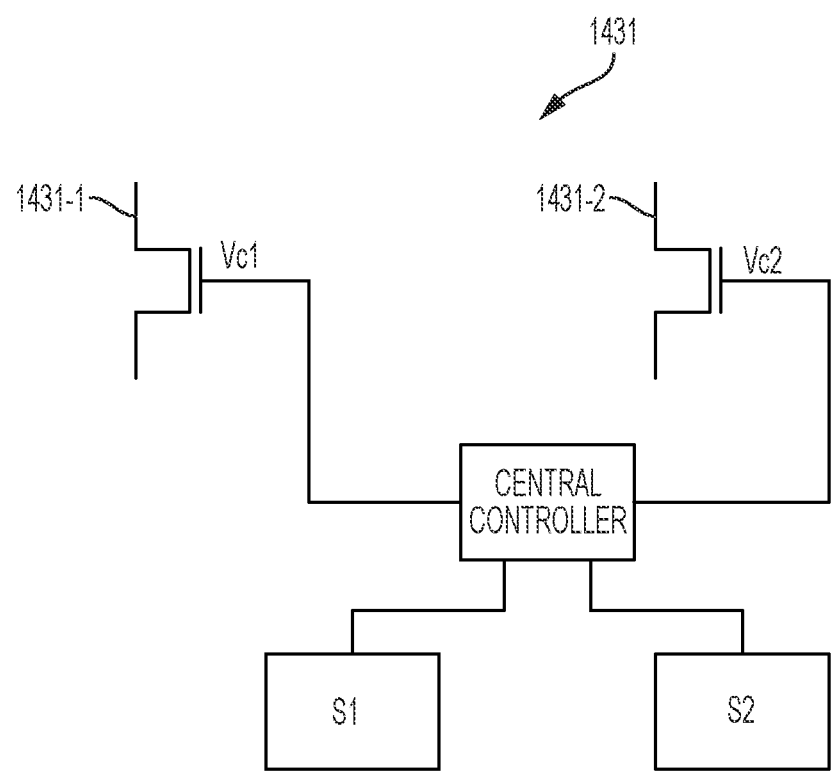
FIG. 14 illustrates a current limiter comprising an array of ECTs that are controlled by a central controller in accordance with some embodiments.

In some embodiments, multiple ECTs of a current limiter, e.g., all the ECTs, are controlled by a central controller as illustrated in FIG. 14. FIG. 14 illustrates a current limiter 1431 comprising an array of ECTs represented by ECT 1431-1 and 1431-2. The operation of ECT 1431-1 is controlled by Vc1 at the control electrode of ECT 1431-1 and the operation of ECT 1431-2 is controlled by Vc2 at the control electrode of ECT 1431-2. The control electrodes of ECT 1431-1 and 1431-2 are coupled to a central controller which generates voltages Vc1 and Vc2. The central controller may receive sensed information from one or more sensors, S1, S2 as illustrated in FIG. 14. The sensed information may indicate operating parameters of the energy device, e.g., current, voltage, temperature, stress, strain, humidity, presence of chemicals or gases, etc.

In one example configuration, S1 and S2 are temperature sensors in thermal contact with localized regions of the energy device. S1 measures the temperature from region R1 and S2 measures the temperature from region R2. The central controller receives the sensed temperature value from S1 and compares the sensed temperature value to a stored temperature value. If the sensed temperature value exceeds the stored temperature value, the central controller adjusts Vc1 such that the current through ECT 1431-1 is reduced. Similarly, the central controller receives the sensed temperature value from S2 and compares the sensed temperature value to a stored temperature value. If the sensed temperature value exceeds the stored temperature value, the central controller adjusts Vc2 such that the current through ECT 1431-2 is reduced.

In some embodiments, the central or local controller may use additional measured or calculated information about the battery or energy device, e.g., age of the battery, number of charge and discharge cycles, and/or state of charge of the battery to generate the control voltages Vc1, Vc2. For example, if the number of charge/discharge cycles is low, the local or central controller may allow more current to flow through the local regions of the battery. As the number of charge/discharge cycles increases, the local or central controller may decrease the current flowing through the local regions of the battery. In some embodiments, the central or local controller may use the additional measured or calculated information about the battery or energy device alone or in conjunction with sensed battery or energy device operating parameters.

The local controllers and/or central controller may be implemented using discrete circuitry or integrated circuitry. In some embodiments, each of the local controllers and/or the central controller are implemented using a programmable logic array. In some embodiments, each of the local controllers and/or the central controller comprises a microprocessor implementing program steps stored in firmware or software.

Figure 15:
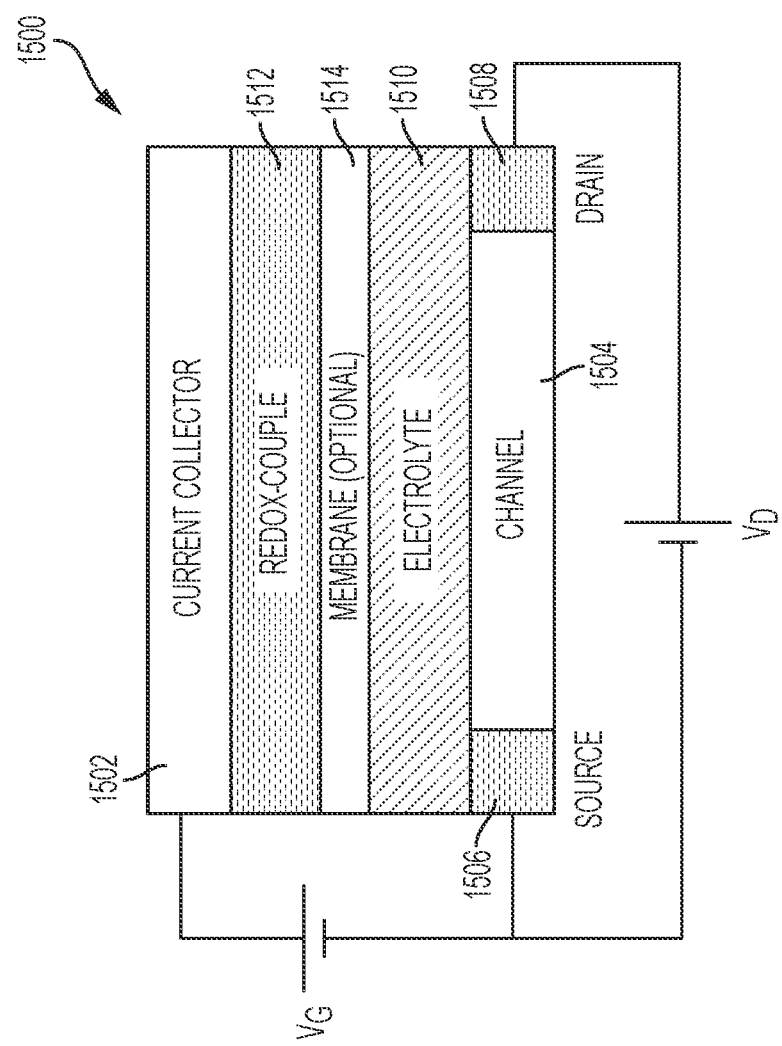
FIGS. 15 and 16 illustrate another ECT structure that can be used in current limiters as discussed herein.
Figure 16:
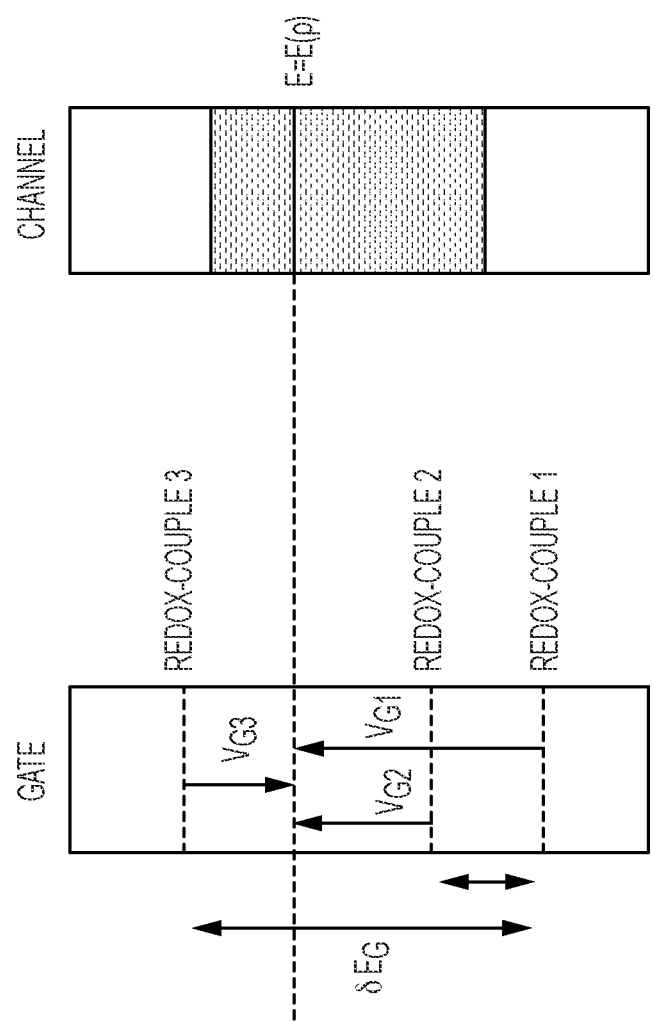

FIGS. 15 and 16 illustrate another ECT structure that can be used in current limiters as discussed herein. ECT 1500 can include a current collector 1502, a channel 1504, a source electrode 1506, a drain electrode 1508, an electrolyte layer 1510, a redox-couple layer 1512, and an optional membrane layer 1514. Current collector 1502 can be made of conductive but inert material, such as Au, Ag, Pt, C, Al, etc. Channel 1504 can be made of conductive polymers with high carrier mobility, such as PEDOT:PSS. Source electrode 1506 and drain electrode 1508 can be similar to the source and drain electrodes, respectively, used in the ECT 400 illustrated in FIG. 4, for example.

Electrolyte layer 1510 can include various types of electrolytes, such as water with dissolved salt (e.g., NaCl), an organic solvent with dissolved salt, an ionic liquid, a polymer with dissolved salt, a single-ion conducting polymer, a crystalline electrolyte, etc. Alternatively, electrolyte layer 1510 can include electrolyte in gel or solid form.

Redox-couple layer 1512 can include one or more redox-couples. A redox-couple can include a reduced species (e.g., $Fe^{2+}$) and its corresponding oxidized form (e.g., $Fe^{3+}$). Examples of redox-couples included in redox-couple layer 1512 can include, but are not limited to: Ferricyanide/Ferrocyanide ($Fe(CN)_6^{3-/4-}$), Iodide/Triiodide ($I^-/I_3^-$), viologen and its derivatives, indigo and its derivatives, Ag/AgCl, Prussian blue, polyaniline, PEDOT, Cu/Cu', ferrocene and its derivatives, etc. In some embodiments, at least two redox-couples can be included in redox-couple layer 1512. For example, redox-couple layer 1512 can include two redox-couples with very different formal potentials, thus allowing for a sharp change in threshold voltage when charges are injected into the gate. Redox-couple layer 1512 can be in liquid form (e.g., redox-couples dissolved in electrolyte) or solid form. When redox-couple layer 1512 comprises liquid (e.g., when the redox-couples are dissolved in electrolyte), membrane layer 1514 can be used to separate the redox-couples from channel 1504, thus preventing the redox-couples from reacting with the channel material. More specifically, the membrane should allow carrier movements between electrolyte layer 1510 and redox-couple layer 1512, while preventing redox-couple species from entering electrolyte layer 1510. Membrane layer 1514 can include a porous glass frit, an ion selective membrane, ion-conductive glass, a polymer membrane, an ionically conductive membrane, etc. When redox-couple layer 1512 includes solid-state redox-couples, membrane layer 1514 can be optional. Examples of solid-state redox-couples can include, but are limited to: electrochemically active polymers, insoluble organic and inorganic redox couples, and intercalation materials.

The electrochemical potential of channel 1504 can be a function of the doping level of channel 1504. As previously discussed, channel 1504 can be p-type doped, and the doping level of channel 1504 at $V_G=0$ V depends on the difference between the electrochemical potentials of the redox process occurring at channel 1504 and the redox process occurring at redox-couple layer 1512. For a particular channel material, the doping level of channel 1504 can then be adjusted by adjusting the electrochemical potential of redox-couple layer 1512.

One approach for doing so is to select one or more appropriate redox-couples.

FIG. 16 presents an energy diagram depicting the energy level of the gate with respect to the energy level of the channel when three different redox-couples are used as gate material, according to one embodiment. In FIG. 16, the left side of the drawing shows the electrochemical potential of the gate when three different redox-couples are used as the gate material, with redox-couple 1 providing the lowest potential, while redox-couple 3 provides the highest. The right side of the drawing shows the electrochemical potential of the channel, which can be a function of the channel doping level. The shading indicates the range of potentials reached during the operation of the transistor, including the "on" and "off" stages. At an arbitrary doping level ρ, the electrochemical potential within the channel ($E_C$) can be expressed as $E_C=E_C(ρ)$, where ρ is the doping level, as indicated by the solid line. The electrochemical potential within the channel is related to the electrochemical potential within the gate ($E_G$) and the gate voltage ($V_G$) according to the equation $E_C=E_G+V_G$.

FIG. 16 also shows that, in order for the channel to reach the arbitrary doping level, different gate voltages are required for the three different gate materials. More specifically, $V_{G1}$ is required for redox-couple 1, $V_{G2}$ is required for redox-couple 2, and $V_{G3}$ is required for redox-couple 3, respectively. From FIG. 16, one can also see that, for two different gate materials, the difference in the required gate voltages ($δV_G$) to reach the same doping level can depend on the difference in the electrochemical potentials ($δE_G$) of the two gate voltages. In other words, $V_{G2}-V_{G1}=E_{G1}-E_{G2}$. For example, using redox-couple Ag/AgAl as a reference, δE for redox-couple viologen ($Viol^{2+/1+}$) can be $-0.6V$, and $δE_G$ for redox-couple ferricyanide/ferrocyanide ($Fe(CN)_6^{3-/4-}$) can be 0.21V.

Figure 17:
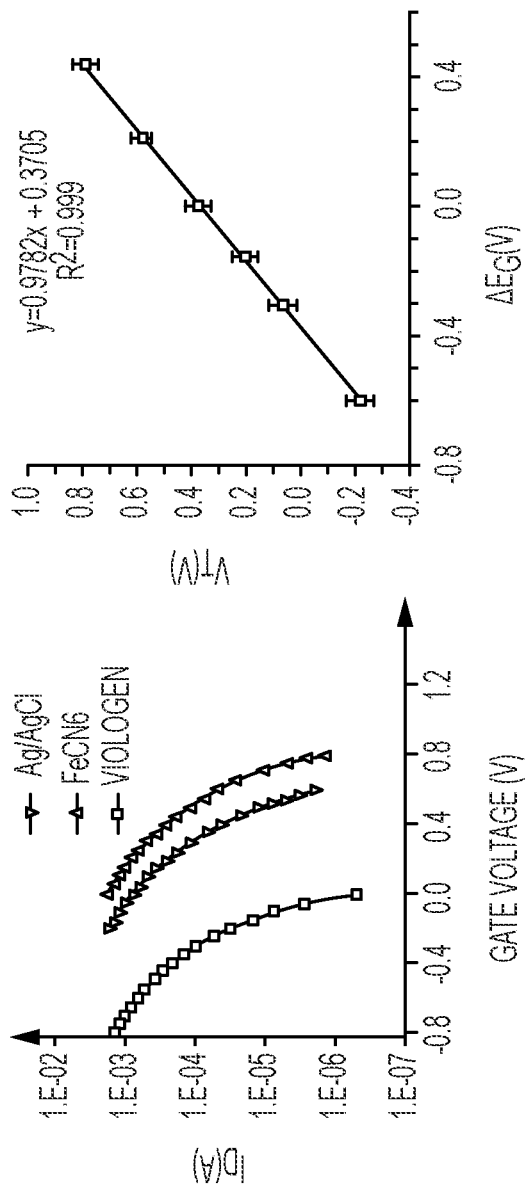
FIG. 17 shows the transfer functions and threshold voltages of three PEDOT:PSS-based OECTs gated with three different types of redox-couple, according to one embodiment.

FIG. 17 shows the transfer functions and threshold voltages of three PEDOT:PSS-based OECTs gated with three different types of redox-couple, according to one embodiment. The left side of the drawing shows the transfer curves for OECTs gated with Ag/AgCl, ferricyanide/ferrocyanide, and viologen. From the drawing, one can see that the transfer curves shift laterally significantly when different gate materials are used. More specifically, compared to the transfer curve of the OECT gated by Ag/AgCl (the center curve), the transfer curve for the OECT gated by viologen shifts to the left (by roughly 0.6 V), and the transfer curve for the OECT gated by ferrocyanide shifts to the right (by roughly 0.21 V). According to the transfer curves, when the gate is unbiased (i.e., $V_G=0$), the OECT gated by Ag/AgCl is neither completely on nor completely off. However, by selecting a redox-couple with a positive $δE_G$ (e.g., ferrocyanide), the OECT can be turned on more at zero gate bias. Similarly, by selecting a redox-couple with a negative $δE_G$ (e.g., viologen), the OECT can be turned off at zero gate bias. The ability to turn off the transistor at zero bias makes it possible to make an accumulation mode OECT transistor based on PEDOT:PSS. The operation of an OECT in accumulation mode allows for low power consumption devices with high ON/OFF ratios. This approach to constructing accumulation mode OECT transistors can retain the ease of processing and high carrier mobility of PEDOT:PSS while allowing for lower circuit power consumption and more flexibility in circuit design.

The right side of FIG. 17 shows the threshold voltages for OECTs gated with different redox-couples as a function of $δE_G$, using Ag/AgCl as reference. The slope of the curve is shown to be roughly 1, meaning that the threshold voltage can be tuned on a one on one ratio by tuning $δE_G$. For example, by selecting a gate material to obtain a $δE_G$ of 0.6 V, one can move the threshold voltage ($V_T$) by 0.6 V. Because there is a wide variety of redox-couples to select from, including but not limited to: $Fe(CN)_6^{3-}/4-$, $I^-/I_3^-$, viologen and its derivatives, indigo and its derivatives, Ag/AgCl, Prussian blue, polyaniline, PEDOT, $Cu/Cu^{2+}$, ferrocene and its derivatives, etc., there can be a wide range of shifting of the threshold voltage. Moreover, one can also modulate the composition ratio within a particular redox-couple to fine-tune $\delta E_G$, hence $V_T$. For example, using Ag/AgCl as reference, the $\delta E_G$ for redox-couple $Fe(CN)_6^{3-}/4-$ can be roughly 0.2V if the redox-couple layer includes the same amount of $Fe(CN)_6^{3-}$ and $Fe(CN)_6^{4-}$. Note that $Fe(CN)_6^{3-}$ and $Fe(CN)_6^{4-}$ can coexist in an aqueous solution. On the other hand, if one increases the amount of $Fe(CN)_6^{4-}$ by ten-fold, $\delta E_G$ can be decreased by 60 mV. Similarly, $\delta E_G$ can be increased by 60 mV if the amount of $Fe(CN)_6^{3-}$ is increased by ten-fold. Other ratios between $Fe(CN)_6^{3-}$ and $Fe(CN)_6^{4-}$ an result in different amounts of adjustment of $\delta E_G$. Similar fine-tuning of $\delta E_G$ can be achieved for other types of redox-couple as well. This way, one can fine tune $V_T$ of the PEDOT:PSS OECTs or ECTs prepared with other channel materials.

In addition to tuning the OECT's threshold voltage by selecting different gate materials, in some embodiments, the threshold voltage of an OECT can be tuned dynamically. More specifically, the OECT with a dynamically tunable $V_T$ can be gated with a redox-couple with electrochemical potentials that can change under certain conditions. Some redox-couples can have electrochemical potentials that can vary in response to stimuli, such as temperature, heat flow, pressure, humidity, etc. For example, the redox-potential of $Fe(CN)_6^{3-/4-}$ can be strongly temperature-dependent due to the high entropy change upon electron transfers. This is also known as the thermogalvanic effect. Some redox-couples can have electrochemical potentials that vary in response to changing analyte concentration (e.g., pH level, ion, biomolecules, gases, etc.) in the environment. For example, the redox-potential of $Cu/Cu^{2+}$ can be sensitive to the concentration of $Cu^{2+}$ ions in the solution.

Figure 18:
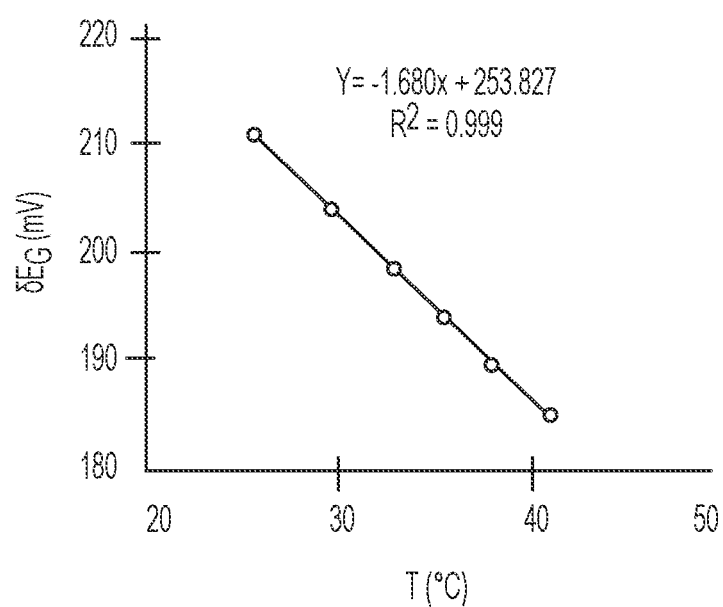
FIG. 18 shows the $\delta E_G$ as a function of temperature for redox-couple $Fe(CN)_6^{3-/4-}$, according to one embodiment.

FIG. 18 shows the $\delta E_G$ as a function of temperature for redox-couple $Fe(CN)_6^{3-/4-}$, according to one embodiment. One can see that $\delta E_G$ can change by about 25 mV when the temperature is increased by roughly 15° C. Other types of temperature-sensitive redox-couples (e.g., molybdenum and tungsten) can also have a similar effect. The thermogalvanic effect allows for local current control based on local temperature sensing. Thus, in some embodiments, the ECT itself can incorporate sensing for local control of the current through the ECT without requiring an external sensor. For example, current limiters according to some embodiments may incorporate ECTs that have stimuli-responsive gates to change the cut-off current as a function of a sensed parameter such as local temperature, local ion-concentration, or local electrode potential.

Additional information about current limiters for energy devices and organic ECTs suitable for use in the current limiters discussed herein can be found in commonly patent U.S. patent application Ser. No. 15/801,125 filed on Nov. 1, 2017 which is incorporated herein by reference in its entirety.

Figure 19:
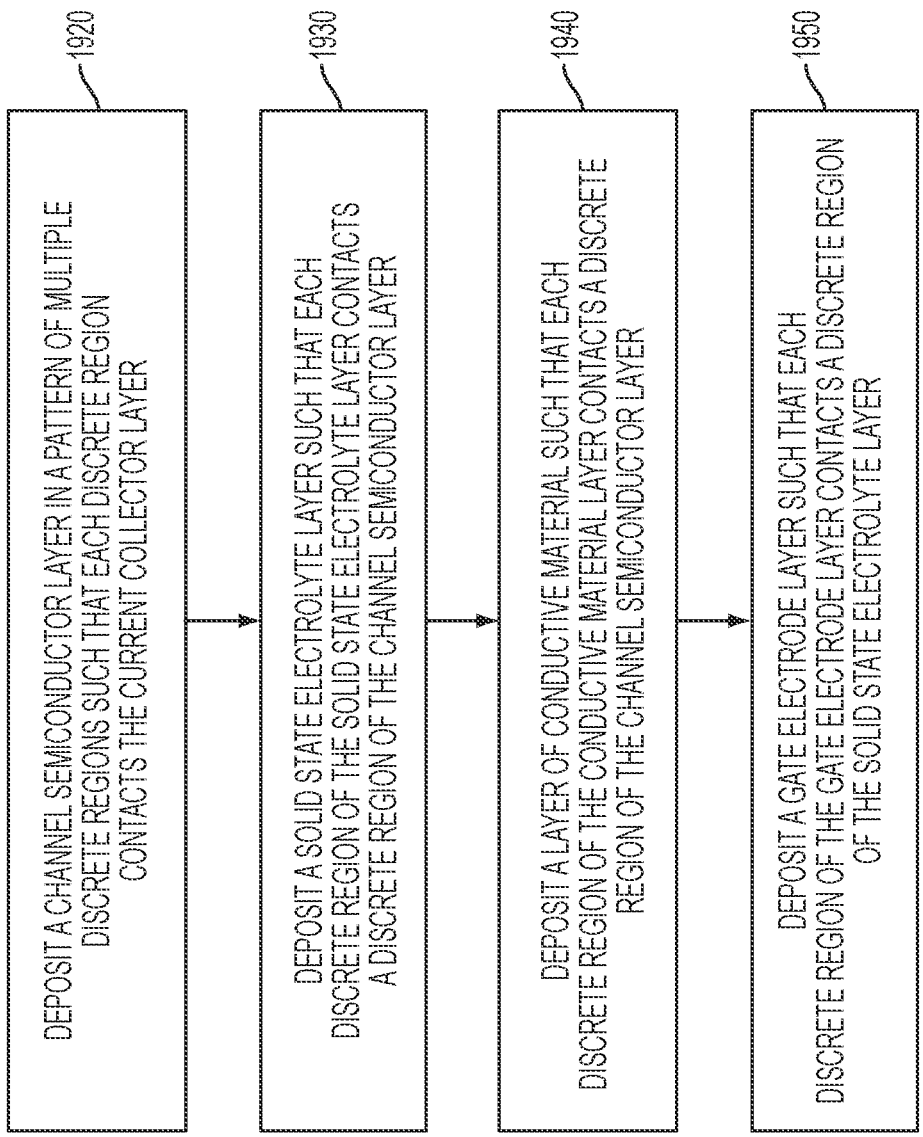
FIG. 19 is a flow diagram illustrating a process of forming a current limiter comprising an array of ECTs in accordance with some embodiments.

Forming a current limiter comprising an array of ECTs as discussed herein is illustrated using the flow diagram of FIG. 19. A channel semiconductor layer is deposited 1920 in a pattern such that multiple discrete regions of the channel semiconductor layer contact a common current collector layer. A solid state electrolyte layer is deposited 1930 in a pattern of multiple discrete regions such that each discrete region of the solid state electrolyte layer respectively contacts a discrete region of the channel semiconductor layer at a first location. A layer of conductive material is deposited 1940 in a pattern of discrete regions such that each discrete region of the conductive material layer respectively contacts a discrete region of the channel semiconductor layer at a second location. A channel can be formed between the first and second locations of each discrete region of the semiconductor layer. A gate electrode layer is deposited 1950 in a pattern of discrete regions such that each discrete region of the gate electrode layer respectively contacts a discrete region of the solid state electrolyte layer. Each discrete region of the gate electrode layer may respectively contact a discrete region of the conductive material layer, the current collector layer, or may be electrically connected to a sensor or other control circuitry. For example, in some embodiments, the gate electrodes may be electrically connected to leads or traces that form an electrical connection between the gate electrodes and other components.

Optionally, a second layer of conductive material is deposited in regions that are electrically isolated from the channel semiconductor layer. In this embodiment, the gate electrode layer can be deposited such that each discrete region of the gate electrode layer contacts a discrete region of the solid state electrolyte layer and a discrete region of the conductive material layer or the second conductive material layer or the current collector layer. The second conductive material layer can be used to provide a sensor input to the gate electrode layer, for example.

Figure 20A:
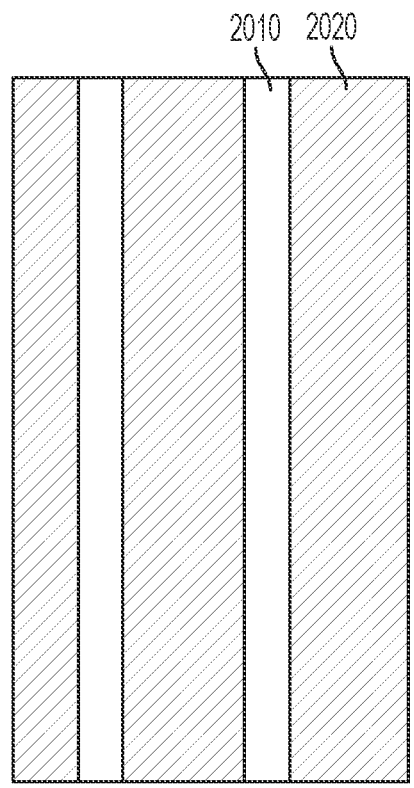
Figure 20B:
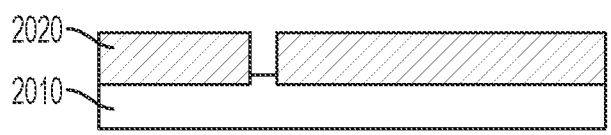
Figure 21A:
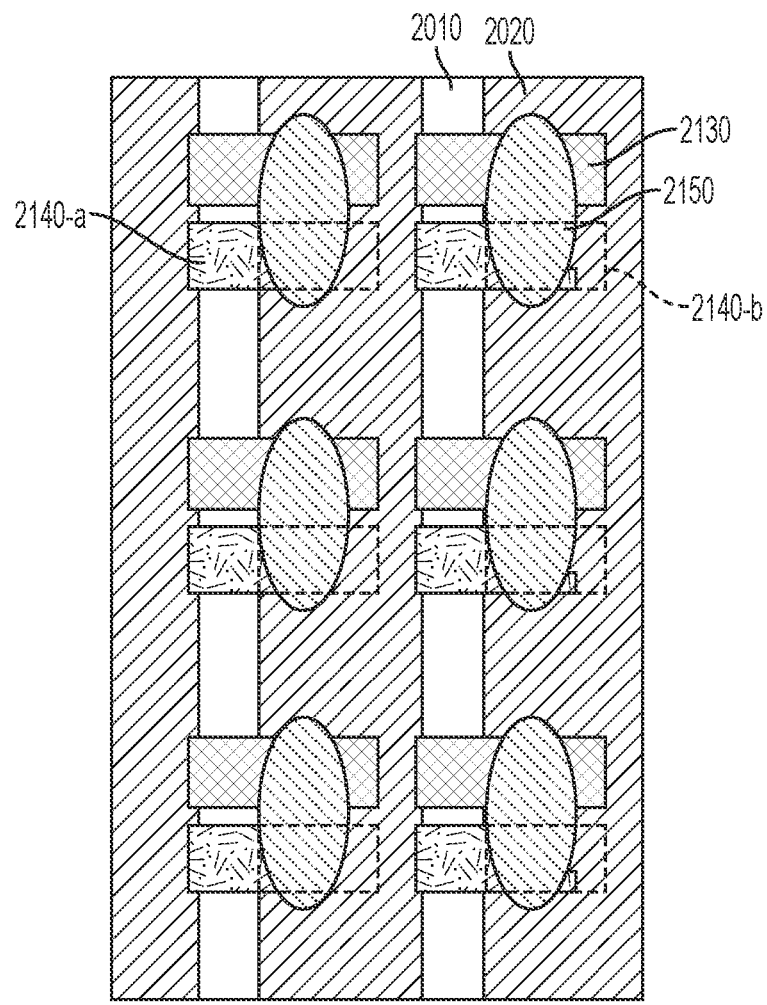
Figure 21B:
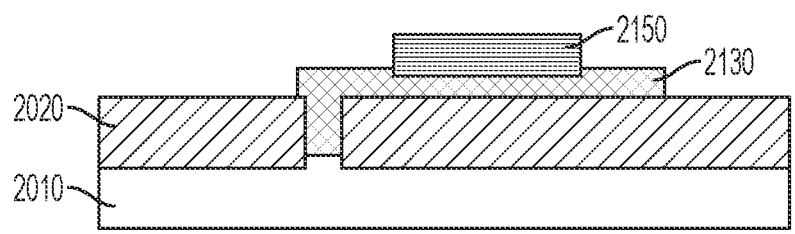
Figure 22A:
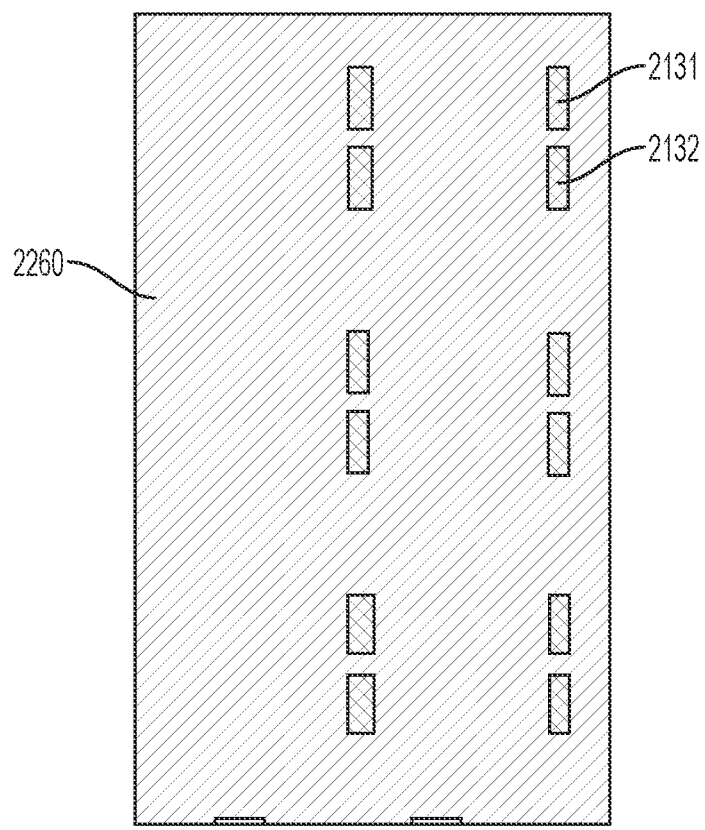
Figure 22B:
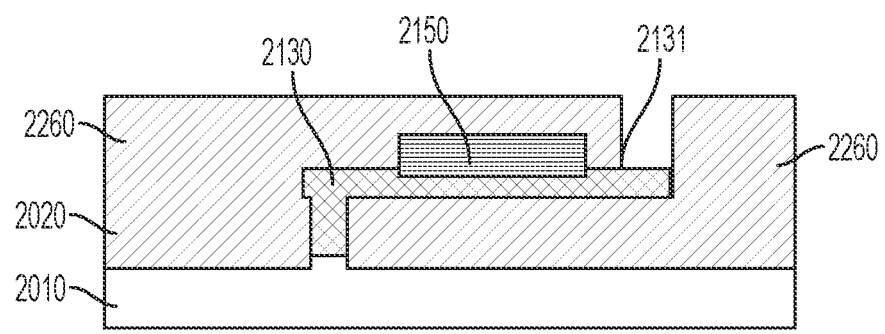
Figure 23A:
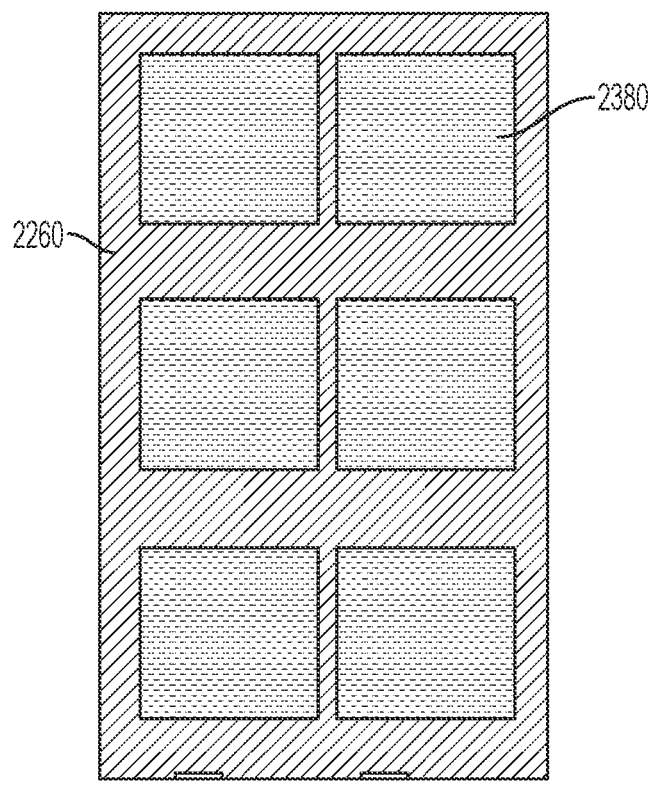
Figure 23B:
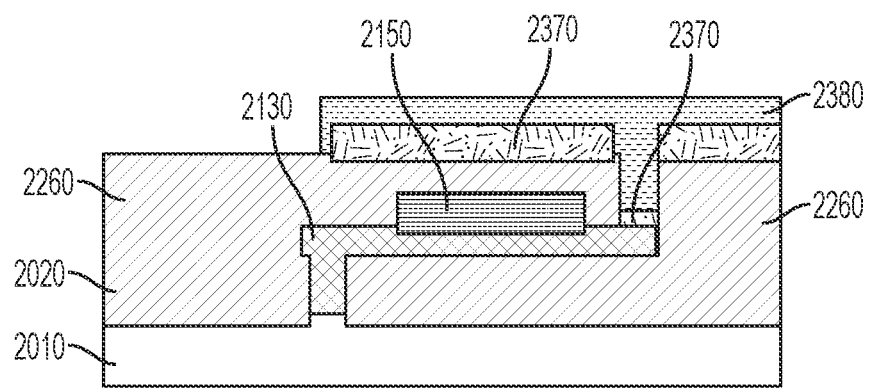

FIGS. 20A through 23A and 20B through 23B illustrate top down and side views, respectively, of a method for preparing a current limiter comprising an array of ECTs disposed on a current collector layer in a scalable, cost effective process. In some embodiments, these techniques can be achieved by low cost printing and/or coating techniques without photolithography and/or etching steps. FIGS. 20A and 20B show top and side views, respectively, after depositing a first insulator layer 2020 in a striped pattern on the surface of a current collector layer 2010 leaving strips of the current collector layer 2010 exposed. FIGS. 21A and 21B show top and side views, respectively, after deposition of the semiconductor layer 2130, the gate electrode layer 2140, and the solid state electrolyte layer 2150. A semiconductor channel layer 2130 is deposited in a pattern of discrete regions such that each discrete region of the semiconductor channel layer 2130 makes contact with the current collector layer 2010. A gate electrode layer 2140-*a* is deposited in a pattern of discrete regions such that each discrete region of the gate electrode layer 2140-*a* makes contact with the current collector layer 2010. Alternately, a gate electrode layer 2140-*b* can be deposited in a pattern of discrete regions such that each discrete region of the gate electrode layer 2140-*b* is electrically isolated from the current collector layer 2010. A solid state electrolyte layer 2150 is deposited in a pattern of discrete regions such that each discrete region of the solid state electrolyte layer respectively contacts a discrete region of the gate electrode layer 2140 and a discrete region of the semiconductor channel layer 2130. A second insulator layer 2260 is deposited in a striped pattern that is offset from the first insulator layer 2020, such that portions 2131 of the semiconductor channel layer 2130 remain exposed. If gate electrode 2140-*b* was deposited, then the second insulator layer 2260 is deposited in a pattern that also leaves portions 2132 of the gate electrode 2140-*b* exposed. FIGS. 22A and 22B show top and side views, respectively, after deposition of the second insulator layer 2260. An electroless deposition catalyst 2370 is optionally deposited on the exposed regions 2131 of the semiconductor channel layer 2130, on the second insulator layer 2260 proximate to the exposed regions 2131 of the semiconductor channel layer 2130, and (if applicable) on the exposed regions 2132 of the gate electrode 2140-b. The subassembly is exposed to an electroless copper or nickel deposition bath to form a layer of electrically conductive material 2380 patterned into discrete regions wherein each discrete region of electrically conductive material contacts 2380 is respectively electrically coupled to a discrete region of the semiconductor channel layer 2130 and (if applicable) a discrete region of gate electrode layer 2140-b. Alternately, the electrically conductive material 2380 can be printed, laminated, evaporated, or sputtered onto the exposed regions 2131 of the semiconductor channel layer 2130, onto the second insulator layer 2260 proximate to the exposed regions 2131 of the semiconductor channel layer 2130, and (if applicable) onto the exposed regions 2132 of the gate electrode 2140-b. FIGS. 23A and 23B show top and side views respectively after the patterned layer 2380 of electrically conductive material is formed. An energy device having an active region that generates or consumes energy may be formed on the patterned layer 2380 of electrically conductive material such that the patterned layer 2380 of electrically conductive material forms the anode or cathode of the energy device.

Embodiments disclosed herein involve one or more arrays of electrochemical transistors that are used as local current limiters within a battery or other active energy producing or consuming device. These current limiters can be passively or actively controlled. The electrochemical transistor arrays can be printed or otherwise patterned onto the metal foils already used as current collectors in batteries to control the flow of current between the current collector and active material, for example. Compared to printed field-effect transistors, the current carried by electrochemical transistors is significantly higher, which enables their use in the current limiting applications discussed herein. The differential resistance of these devices at low currents can be quite low (meaning they do not contribute significantly to the battery or energy device's internal impedance), but at higher currents the differential resistance sharply increases. Furthermore, the current at which the sharp increase in resistance occurs can be tuned by applying different gate voltages. These gate voltages can be actively applied or a similar effect can be achieved by using a 0V gate voltage with gates of differing electrochemical potential (as described with reference to FIGS. 15 through 18 of this disclosure and in U.S. patent application Ser. No. 15/801,125 which is incorporated by reference herein).

One embodiment of a current limiter involves an array of ECTs printed or otherwise deposited onto a current-carrying metal foil which forms the current collector for the battery. The ECTs all share a common electrode, which is the current collector for the battery. The other electrode in contact with the ECT channel is a conductive pad that is electrically isolated from the other ECTs. The gate electrode can be shorted to either end of the channel electrode, which dictates which direction of current is limited. Alternately, gate lines can be run to the edge of the array and the gate voltage (e.g., the voltage between the gate and the underlying current collector) can be actively controlled to change the current cut-off as a function of time or location.

These current limiters can be directly used with existing battery manufacturing process lines in several possible configurations. The electrochemical transistors can be deposited on the negative electrode, the positive electrode, or both. Furthermore, the gate electrode can be shorted to either the common current collector or the conductive pad in contact with the battery electrolyte, depending on which direction of current is to be limited. Furthermore, multiple ECTs can be placed in series to limit the current flow in both directions. By limiting the discharge current flowing through the negative or positive current-collector, the rate of self-discharge during an internal short-circuit can be decreased. On the other hand, by limiting the charging current through the negative electrode, the lithium plating and the formation of lithium dendrites can be suppressed, which decreases the likelihood of an internal short-circuit. Additional design flexibility can be achieved by also incorporating current-limiters on the both electrodes of the battery.

Embodiments include a configuration where discharge current through both the positive and negative electrodes is limited, which would further reduce the rate of self-discharge during an internal short-circuit. Alternately, the limiting current directions can oppose each other as shown in FIG. 7D, so the negative electrode limits the charging current while the positive electrode limits the discharging current. Numerous other permutations and combinations of current limiters incorporating ECTs are possible.

Current limiters as discussed herein reduce the impact of manufacturing defects or other inhomogeneities in the battery which can lower the resistance to current flow at a particular spot on the current collector leading to a current hot spot. As previously discussed, hot-spots can lead to decreased cell capacity as the cell is degraded near the current hot spot. In extreme scenarios, hot-spots can lead to filament formation and thermal runaway. When shorts form within the battery, the battery capacity may rapidly discharge through the short, leading to overheating and fire. In battery cells equipped with current limiting capability as discussed herein, current hot-spots are suppressed and the rate of self-discharge through a short is slowed.

The current limiters incorporate ECTs and optional control circuitry which can be readily incorporated in existing battery, photovoltaic cell, and fuel cell fabrication processes. The on-current and series resistance of ECTs can be matched to battery control requirements. The technology of the current limiters discussed herein is inexpensive and affords a fine level of spatial control granularity which allows for improvements in other battery and battery-pack components such as separators, battery management systems, less expensive and/or smaller thermal management systems, etc. The current limiters discussed herein can be used to increase charging speed and/or to prolong battery lifetime and/or to reduce uniformity requirements because of feedback. In contrast to thermal shutdown mechanisms, the current limiters comprising ECTs are capable of stopping destructive current flow before it leads to rapid temperature rise.

In some embodiments, the ECTs incorporate stimuli-responsive gates to change the cut-off current as a function of some sensed quantity such as temperature, local ion-concentration, or local electrode potential (state-of-charge).

In some embodiments, multiple ECTs can be connected in series in order to limit the current-flow in both directions. Control structures such as current mirror connections can be used to equalize current through the various cells. More complex printed electronics can also be used to independently control each electrochemical transistor to yield more complex charging and discharging behavior that varies in space and/or time.

Figure 24:
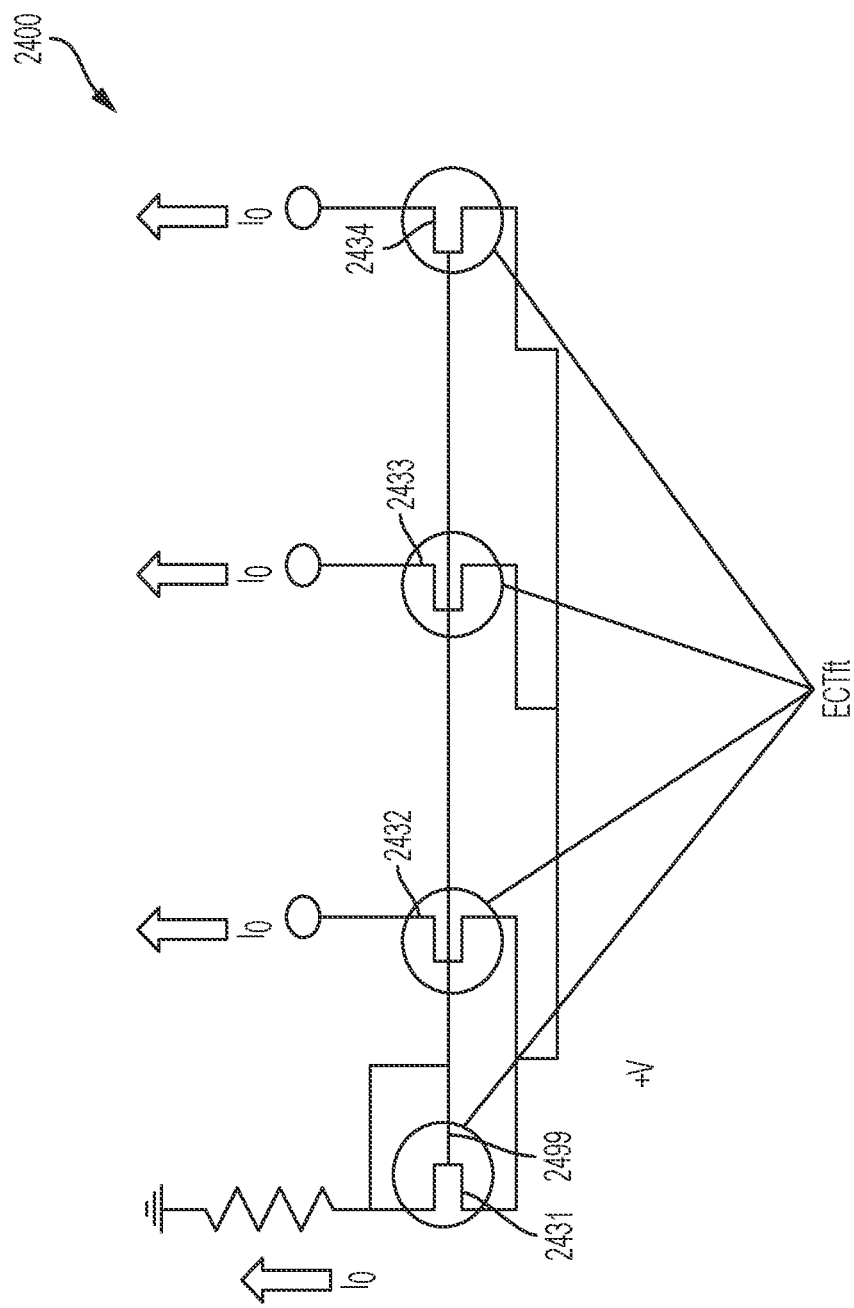
FIG. 24 schematically depicts a current mirror circuit that may be employed in some embodiments.

FIG. 24 schematically depicts a current mirror connection that can be used in a current limiter structure in accordance with some embodiments. The first control ECT 2431 generates a voltage +V at trace 2499 that sustains a current of $I_0$ through ECT 2431. The voltage +V then adjusts the currents through the other ECTs 2432, 2433, 2434 to match or mirror $I_0$. In this way the given or control current can be replicated. If the ECTs 2431-2434 are respectively connected to multiple energy devices (not shown in FIG. 24), the current through the multiple energy devices can be controlled and/or equalized to a common value through the current mirror structure depicted in FIG. 24. The common value can be a particular sub cell or a special control circuit. To the extent that the ECT properties match, the current through each of the subcells will match the current through the control device.

Figure 25:
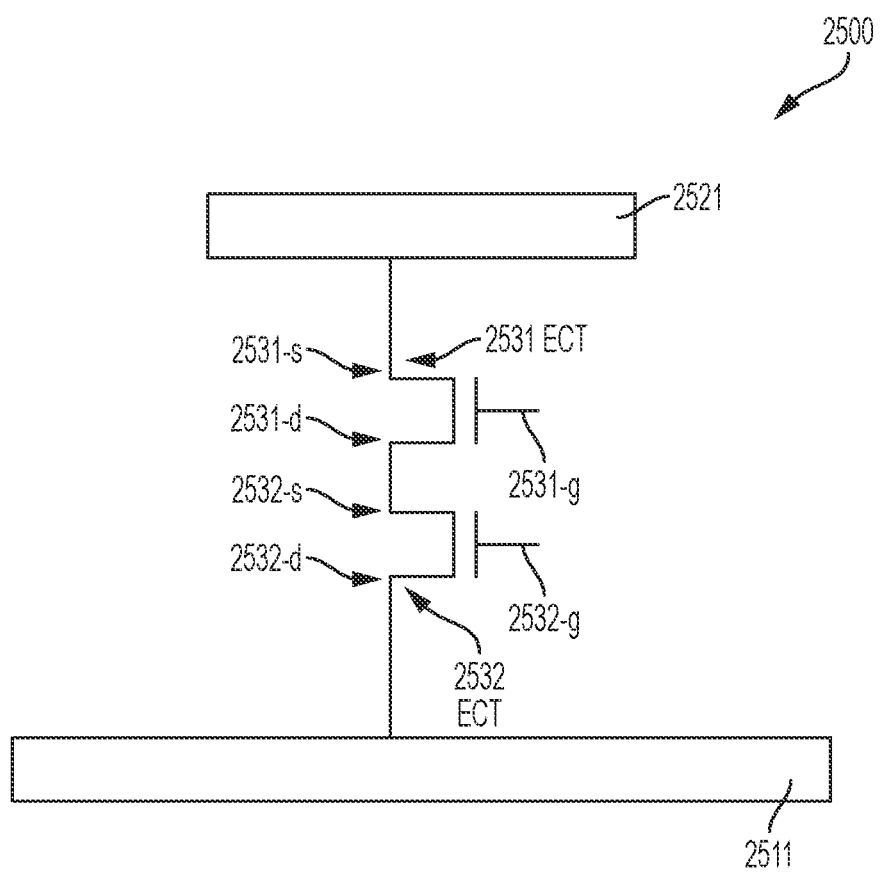
FIG. 25 illustrates a schematic diagram of two series-connected ECTs in accordance with some embodiments.

FIG. 25 illustrates a current limiter 2500 in accordance with some embodiments wherein two ECTs 2531, 2532 are connected in series. Two ECTs 2531, 2532 in series are disposed between a common current collector 2511 and a contact pad 2521. Electrode 2531-*s* of ECT 2531 is in contact with the isolated contact pad, electrode 2531-*d* of ECT 2531 is in contact with electrode 2532-*s* of ECT 2532, and electrode 2532-*d* of ECT 2532 is in contact with the common current collector 2511. The gate 2531-*g* of ECT 2531 can be connected to electrode 2531-*s*, 2531-*d*, or to an external control voltage applied with respect to 2511 or 2531-*d*. The gate 2532-*g* of ECT 2532 can be connected to electrode 2532-*s*, 2532-*d*, or to an external control voltage applied with respect to 2511 or 2532-*s*.

The ECTs 2531, 2532 (and other ECTs described herein) can be n-type, p-type, accumulation-mode, depletion-mode, and any combination of these types. For example, if ECTs 2531 and 2532 are both p-type depletion-mode ECTs, the gate 2531-*g* can be shorted to 2531-*d* and gate 2532-*g* can be shorted to 2532-*s* to achieve current-limiting in both directions. Alternately, a similar effect could be obtained by shorting gate 2531-*g* to 2531-*s* and gate 2532-*g* to 2532-*d*. Furthermore, one of the ECTs 2531, 2532 can be used as a passive current-limiter while the other ECT can be actively controlled. Various permutations and combinations of ECTs will be obvious to a practitioner skilled in the art.

The current limiters discussed herein are useful to control the current flow in batteries as well as fuel cells, photovoltaic cells, electroplating and electro-etching cells, and other photoelectrochemical or electrochemical cells.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A method, comprising:
   depositing a first insulator layer on a current collector layer in a first striped pattern;
   depositing a channel semiconductor layer in a pattern such that multiple discrete regions of the channel semiconductor layer are disposed over first non-insulated portions of the current collector layer;
   depositing a solid state electrolyte layer in a pattern of multiple discrete regions such that each discrete region of the solid state electrolyte contacts a region of the channel semiconductor layer;
   depositing a layer of conductive material in discrete regions such that each discrete region of the conductive material layer makes contact with a discrete region of the channel semiconductor layer; and
   depositing a gate electrode layer in a pattern of discrete regions such that each discrete region of the gate electrode layer contacts a discrete region of the solid state electrolyte layer and a discrete region of the conductive material layer or the current collector layer.

2. The method of claim 1, further comprising:
   depositing a second layer of conductive material in regions that are electrically isolated from the channel semiconductor layer; and
   wherein depositing the gate electrode layer comprises depositing the gate electrode layer such that each discrete region of the gate electrode layer contacts a discrete region of the solid state electrolyte layer and a discrete region of the conductive material layer or the second conductive material layer or the current collector layer.

3. The method of claim 1, further comprising depositing a second insulator layer in a second striped pattern over the solid state electrolyte layer such that a portion of the channel semiconductor layer remains exposed.

4. The method of claim 1, further comprising forming an active current generating or consuming device on the conductive material layer such that the conductive material layer forms an anode electrode or a cathode electrode of the active current generating or consuming device.

5. A method, comprising:
   generating or consuming electrical current by an energy device that includes an active region;
   providing localized current control for the energy device using a current limiter comprising a plurality of electrochemical transistors (ECTs) arranged in an array and disposed between the active region and at least one current collector layer, each ECT comprising:
   a drain electrode;
   a source electrode;
   a channel disposed between the drain electrode and the source electrode;
   a gate electrode; and
   an electrolyte that electrically couples the gate electrode to the channel; and
   controlling electrical conductivity of the channel using an electrical signal at the gate electrode.

6. The method of claim 5, wherein the current collector layer is a shared drain electrode or a shared source electrode for the ECTs.

7. The method of claim 5, wherein each ECT in the array provides localized current control for the energy device.

8. The method of claim 5, wherein:
   the current limiter comprises one or more control lines respectively coupled to one of more gate electrodes of the ECTs; and
   the method comprises generating one or more gate control signals on the control lines using control circuitry coupled to the control lines.

9. The method of claim 8, wherein the one or more gate control signals generated by the control circuitry control current through the ECTs of the array based on location of the ECTs.

10. The method of claim 8, wherein the one or more gate control signals generated by the control circuitry control current through the ECTs of the array based on time.

11. The method of claim 8, wherein:
    the current limiter comprises one or more sensors;
    each sensor senses one or more parameters associated with the energy device; and the control circuitry generates the one or more gate control signals based on the one or more sensed parameters.

12. The method of claim 11, wherein the one or more parameters comprises one or more of temperature, concentration of a chemical substance, concentration of a biological substance, pH, humidity, ion concentration, electrical potential, current, resistance, impedance, capacitance, light intensity, stress, strain, and pressure.

13. The method of claim 5, wherein:
the at least one current collector layer comprises a second current collector layer; and
the current limiter comprises a second plurality of ECTs disposed between the active region and the second current collector layer, the second plurality of ECTs arranged in a second array such that each ECT in the second array provides localized current control for the energy device.

14. The method of claim 5, wherein the source electrode or the drain electrode of the ECTs of the array is electrically connected to a patterned electrode of the energy device.

15. The method of claim 14, wherein the gate electrode is disposed on the patterned electrode of the energy device.

16. The method of claim 5, wherein each ECT comprises at least one redox-couple having a predetermined electrochemical potential disposed between the electrolyte and the gate electrode.

17. The method of claim 5, wherein the energy device comprises a battery cell, a photovoltaic cell or a fuel cell.

18. A method, comprising:
generating or consuming electrical current by an energy device that includes an active region;
providing localized current control for the energy device using a current limiter comprising a plurality of electrochemical transistors (ECTs) arranged in an array and disposed between the active region and at least one current collector layer, each ECT comprising:
a drain electrode;
a source electrode;
a channel disposed between the drain electrode and the source electrode;
a gate electrode; and
an electrolyte that physically and electrically couples the gate electrode to the channel; and
controlling electrical conductivity of the channel using an electrical signal at the gate electrode.

19. The method of claim 18, wherein the current collector layer is a shared drain electrode or a shared source electrode for the ECTs.

20. The method of claim 18, wherein each ECT in the array provides localized current control for the energy device.

21. The method of claim 18, wherein the gate electrode is disposed directly on the current collector layer.

22. The method of claim 18, wherein the energy device comprises one of a battery cell, a photovoltaic cell, and a fuel cell.

* * * * *